US012804888B2

(12) United States Patent
Park et al.

(10) Patent No.: US 12,804,888 B2
(45) Date of Patent: Nov. 17, 2026

(54) SEMICONDUCTOR DEVICE

(71) Applicant: Samsung Electronics Co., Ltd., Suwon-si (KR)

(72) Inventors: Sohyun Park, Suwon-si (KR); Inwoo Kim, Suwon-si (KR); Jihun Lee, Suwon-si (KR); Seongtak Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 18/442,363

(22) Filed: Feb. 15, 2024

(65) Prior Publication Data

US 2024/0414909 A1 Dec. 12, 2024

(30) Foreign Application Priority Data

Jun. 7, 2023 (KR) ........................ 10-2023-0072557

(51) Int. Cl.
*H10B 12/00* (2023.01)
*H10W 20/00* (2026.01)
*H10W 20/43* (2026.01)

(52) U.S. Cl.
CPC ....... *H10B 12/482* (2023.02); *H10B 12/0335* (2023.02); *H10B 12/315* (2023.02); *H10W 20/069* (2026.01); *H10W 20/43* (2026.01)

(58) Field of Classification Search
CPC .. H10B 12/485; H10B 12/482; H10B 12/315; H10B 12/0335
See application file for complete search history.

(56) References Cited

U.S. PATENT DOCUMENTS

| | | | | |
|---|---|---|---|---|
| 9,202,774 | B2 * | 12/2015 | Yeom | H10B 12/485 |
| 10,622,249 | B2 | 4/2020 | Yoon | |
| 10,923,390 | B2 | 2/2021 | Yoon | |

FOREIGN PATENT DOCUMENTS

| | | | |
|---|---|---|---|
| KR | 10-0183764 B1 | 4/1999 | |
| KR | 10-0464656 B1 | 1/2005 | |
| KR | 10-2008-0032517 A | 4/2008 | |
| KR | 10-1060715 B1 | 8/2011 | |
| KR | 10-2019-0037845 A | 4/2019 | |

* cited by examiner

*Primary Examiner* — Jose R Diaz
(74) *Attorney, Agent, or Firm* — Muir Patent Law, PLLC

(57) ABSTRACT

A semiconductor device includes an active pattern on a substrate; a gate structure extending through an upper portion of the active pattern; a bit line structure on a central portion of the active pattern; a lower contact plug on each of opposite end portions of the active pattern; and an upper contact plug structure on the lower contact plug. The upper contact plug structure includes a first upper contact plug and a second upper contact plug on the first upper contact plug. The second upper contact plug contacts the first upper contact plug. The first upper contact plug includes a first metal pattern and a barrier pattern covering a lower surface and a sidewall of the first metal pattern. An upper surface of the bit line structure contacts a lower surface of the second upper contact plug and does not contact the barrier pattern.

20 Claims, 36 Drawing Sheets

SEMICONDUCTOR DEVICE

CROSS-REFERENCE TO RELATED APPLICATION(S)

This application claims priority under 35 U.S.C. § 119 to Korean Patent Application No. 10-2023-0072557 filed on Jun. 7, 2023 in the Korean Intellectual Property Office, the disclosure of which is hereby incorporated by reference in its entirety.

BACKGROUND

1. Field

Example embodiments relate to a semiconductor device.

2. Discussion of the Related Art

A DRAM device may include a contact plug structure that electrically connects an active pattern and a capacitor to each other, and the contact plug structure may be disposed between bit line structures. As the integration degree of the DRAM device increases, a distance between the bit line structures decreases, and thus an advanced forming of the contact plug structure between the bit line structures may be useful.

SUMMARY

Example embodiments provide a semiconductor having improved characteristics.

According to example embodiments, there is provided a semiconductor device. The semiconductor device may include an active pattern on a substrate; a gate structure extending through an upper portion of the active pattern; a bit line structure on a central portion of the active pattern; a lower contact plug on each of opposite end portions of the active pattern; and an upper contact plug structure on the lower contact plug. The upper contact plug structure includes a first upper contact plug and a second upper contact plug on the first upper contact plug. The second upper contacts plug contacting the first upper contact plug. The first upper contact plug includes a first metal pattern and a barrier pattern covering a lower surface and a sidewall of the first metal pattern. An upper surface of the bit line structure contacts a lower surface of the second upper contact plug and does not contact the barrier pattern.

According to example embodiments, there is provided a semiconductor device. The semiconductor device may include an active pattern on a substrate; a gate structure extending through an upper portion of the active pattern; a bit line structure on a central portion of the active pattern; a lower contact plug on each of opposite end portions of the active pattern; an upper contact plug structure including a first upper contact plug and a second upper contact plug sequentially stacked in a vertical direction perpendicular to an upper surface of the substrate; and an insulation pattern structure contacting a sidewall of the upper contact plug structure. The insulation pattern structure includes an insulation pattern contacting a sidewall of the first upper contact plug and an insulating spacer structure covering an upper sidewall of the insulation pattern and contacting a sidewall of the second upper contact plug.

According to example embodiments, there is provided a semiconductor device. The semiconductor device may include an active pattern on a substrate; a gate structure extending through an upper portion of the active pattern; a bit line structure on a central portion of the active pattern; a lower contact plug on each of opposite end portions of the active pattern; an upper contact plug structure including a first upper contact plug and a second upper contact plug sequentially stacked in a vertical direction perpendicular to an upper surface of the substrate; and an insulation pattern structure contacting a sidewall of the upper contact plug structure. The insulation pattern structure includes a first insulation pattern, and a second insulation pattern disposed on and contacting the first insulation pattern. In a first direction parallel to the upper surface of the substrate, a width of a lower surface of the second insulation pattern is smaller than a width of an upper surface of the first insulation pattern.

In the method of manufacturing the semiconductor device according to example embodiments, when forming a contact plug structure including a lower contact plug and an upper contact plug, instead of forming the upper contact plug by a single patterning process, the upper contact plug may be formed by separate etching processes for a lower portion and an upper portion of the upper contact plug. The lower portion of the upper contact plug may be formed by a positive patterning process, and the upper portion of the upper contact plug may be formed a damascene process.

Accordingly, an amount of a metal removed by the positive patterning process may be reduced, and thus the difficulty of the positive patterning process may be reduced. Also, a metal residue may not remain after forming the upper portion of the upper contact plug. In addition, a bridging phenomenon between neighboring ones of the upper contact plugs and/or a necking phenomenon in each of the upper contact plugs may be alleviated or prevented.

DETAILED DESCRIPTION

The above and other aspects and features of the semiconductor devices and the methods of manufacturing the same in accordance with example embodiments will become readily understood from detail descriptions that follow, with reference to the accompanying drawings. It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Hereinafter, two directions among horizontal directions that are parallel to an upper surface of a substrate 100, which may be orthogonal to each other, may be referred to as first and second directions D1 and D2, respectively, and a direction among the horizontal directions, which may have an acute angle with respect to each of the first and second directions D1 and D2, may be referred to as a third direction D3. Additionally, a direction perpendicular to the upper surface of the substrate 100 may be referred to as a vertical direction.

Figure 1:
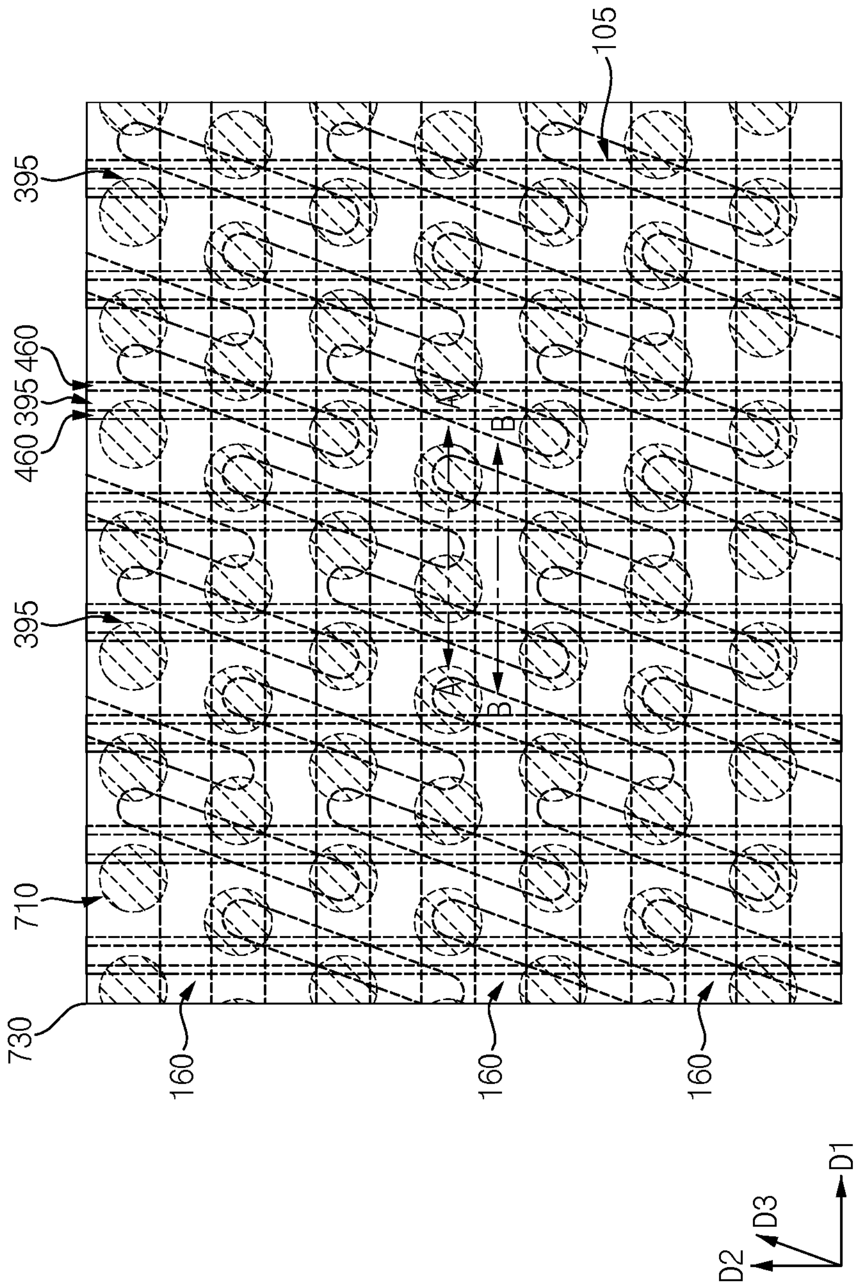
FIG. 1 is a plan view illustrating a semiconductor device in accordance with example embodiments.
Figure 2:
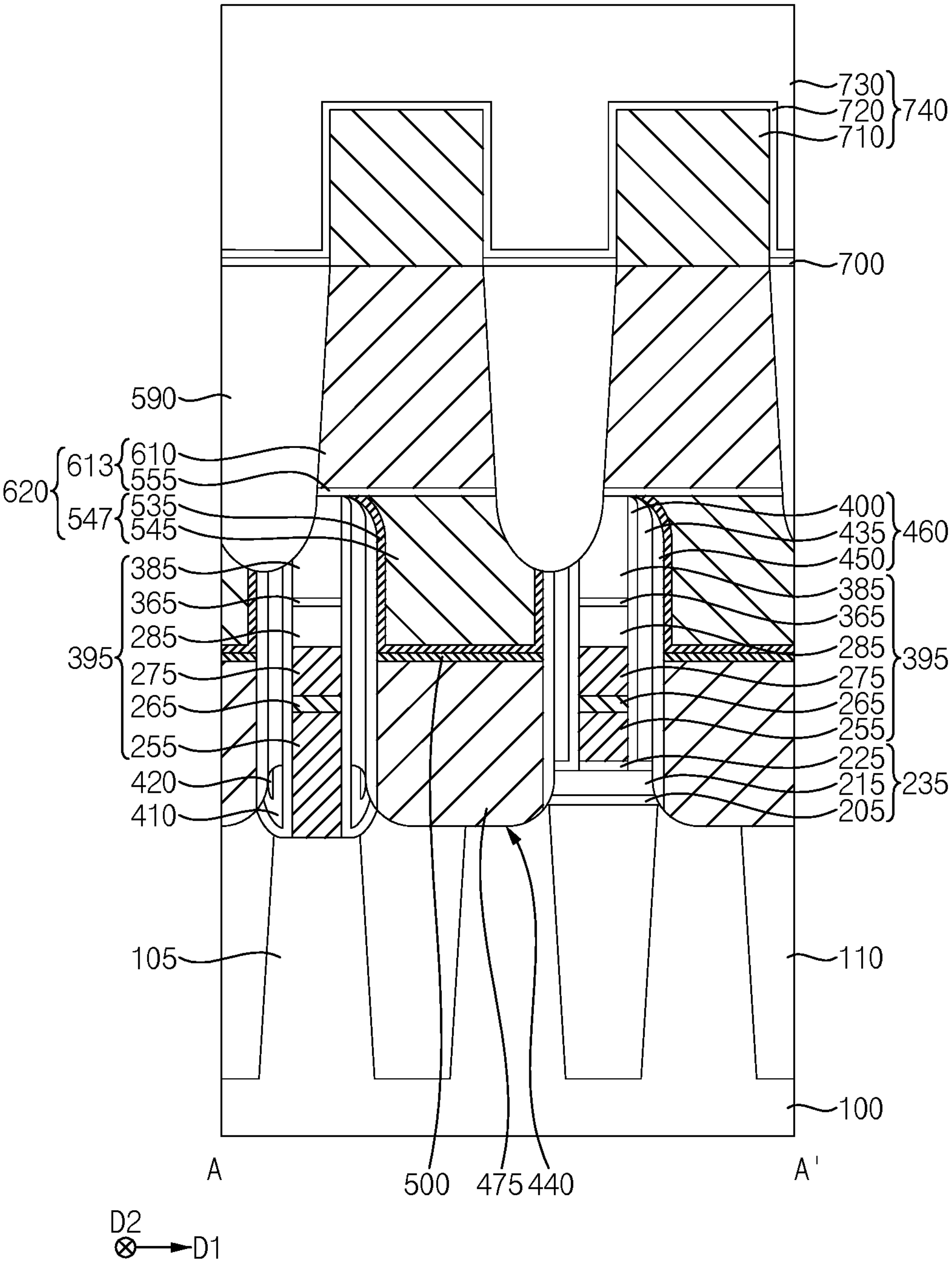
FIG. 2 is a cross-sectional view taken along line A-A' of FIG. 1 according to example embodiments.

FIG. 1 is a plan view illustrating a semiconductor device in accordance with example embodiments, and FIG. 2 is a cross-sectional view taken along line A-A' of FIG. 1 according to example embodiments.

Referring to FIGS. 1 and 2, the semiconductor device may include an active pattern 105, a gate structure 160, a bit line structure 395, a lower contact plug 475, an upper contact plug structure 620 and a capacitor 740 on a substrate 100.

The semiconductor device may further include an isolation pattern 110, a spacer structure 460, a second capping pattern 485, an insulation pattern structure 235, fourth and fifth insulation patterns 410 and 420, a metal silicide pattern 500, a sixth insulation pattern 590 and a second etch stop pattern 700.

The active pattern 105 may extend in the third direction D3, and a plurality of active patterns 105 may be spaced apart from each other in the first and second directions D1 and D2. A sidewall of the active pattern 105 may be covered by the isolation pattern 110. The active pattern 105 may include the same material as the substrate 100, and the isolation pattern 110 may include an oxide, e.g., silicon oxide.

Figure 3:
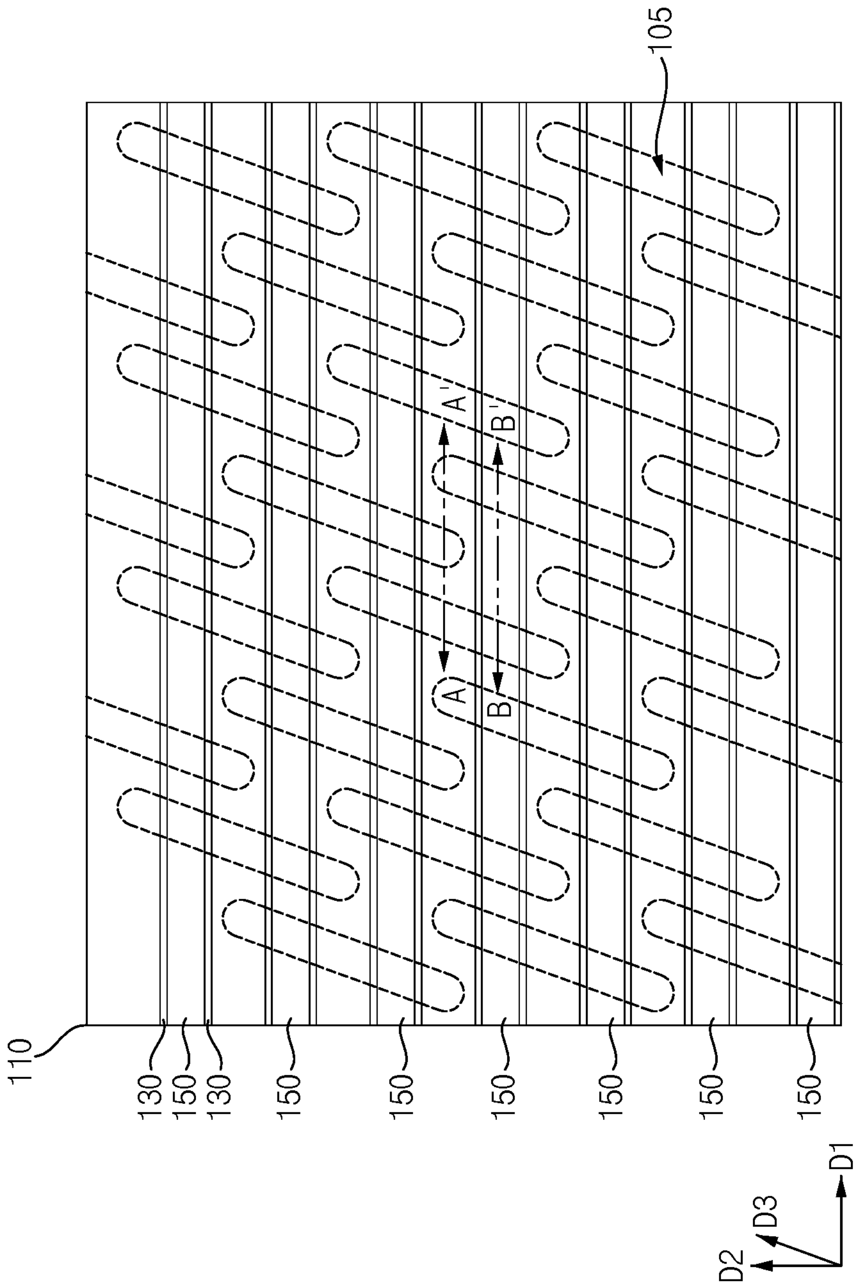
FIGS. 3 to 23 are plan views and cross-sectional views illustrating a method of manufacturing a semiconductor device according to example embodiments.
Figure 4:
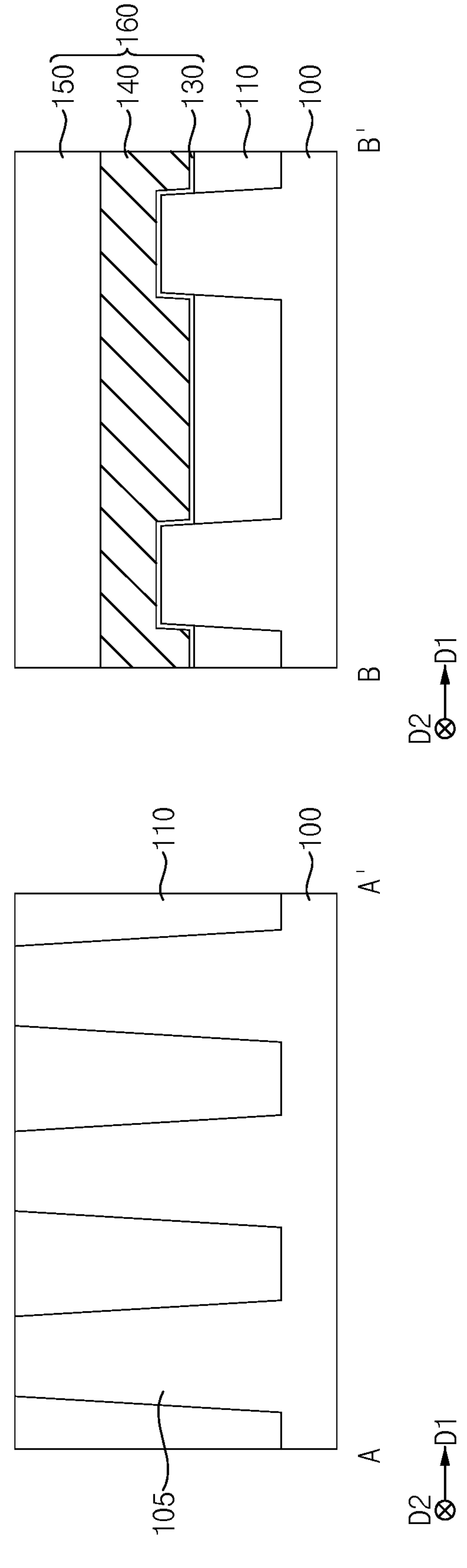

Referring to FIGS. 1 and 2 together with FIGS. 3 and 4, the gate structure 160 may be formed in a second recess extending in the first direction D1 through upper portions of the active pattern 105 and the isolation pattern 110. The gate structure 160 may include a gate insulation pattern 130 on a bottom and a sidewall of the second recess, a gate electrode 140 on a portion of the gate insulation pattern 130 on the bottom and a lower sidewall of the second recess, and a gate mask 150 on the gate electrode 140 and filling an upper portion of the second recess.

The gate insulation pattern 130 may include an oxide, e.g., silicon oxide, the gate electrode 140 may include, e.g., a metal, a metal nitride, a metal silicide, etc., and the gate mask 150 may include an insulating nitride, e.g., silicon nitride.

In example embodiments, the gate structure 160 may extend in the first direction D1, and a plurality of gate structures 160 may be spaced apart from each other in the second direction D2.

Figure 5:
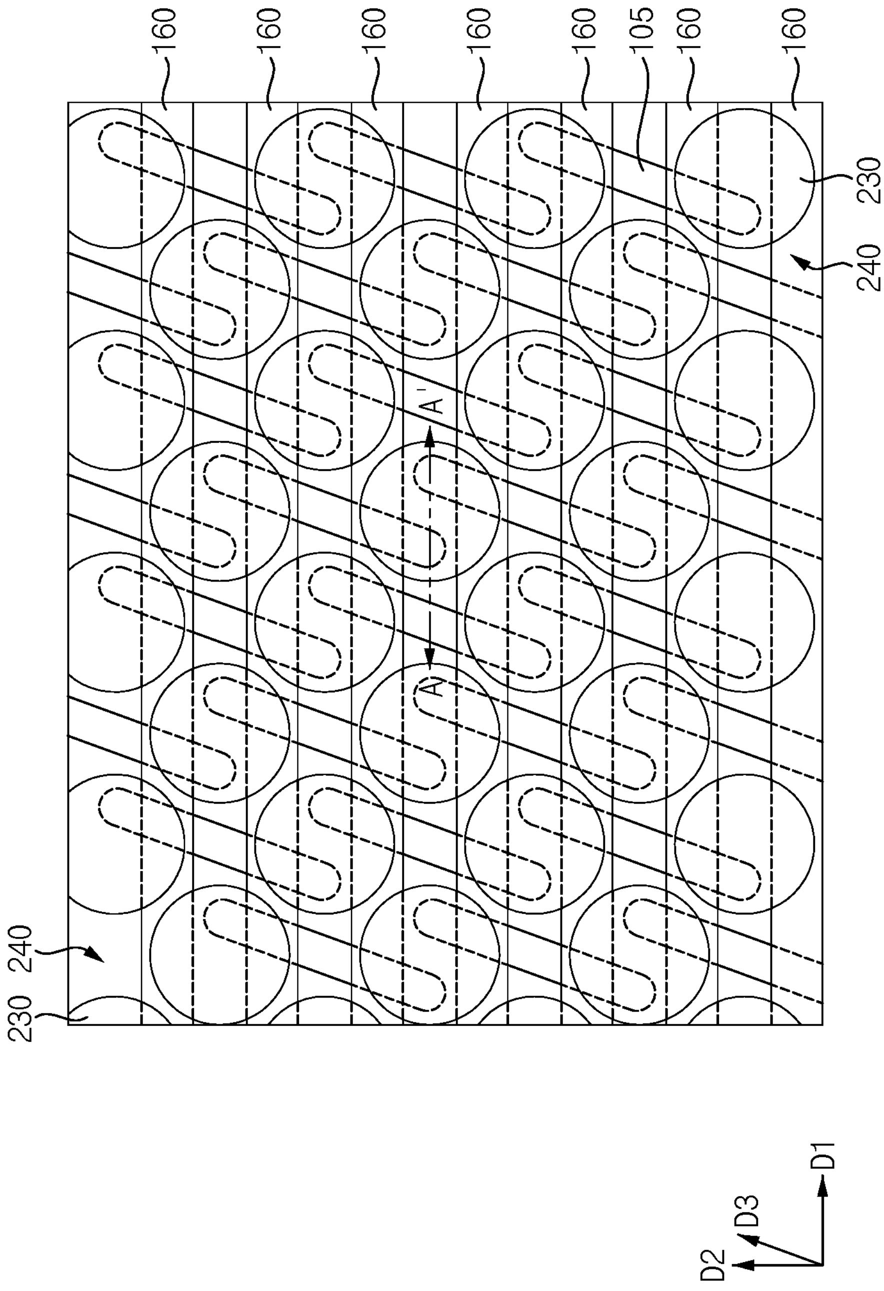
Figure 6:
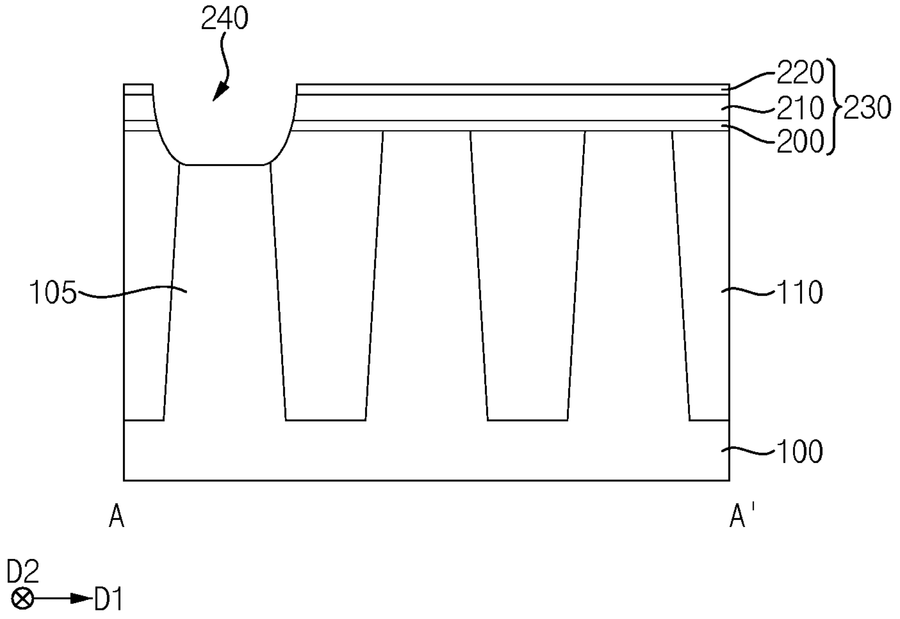

Referring to FIGS. 1 and 2 together with FIGS. 5 and 6, a first opening 240 extending through an insulating layer structure 230 and exposing upper surfaces of the active pattern 105, the isolation pattern 110 and the gate mask 150 of the gate structure 160 may be formed, and an upper surface of a central portion in the third direction D3 of the active pattern 105 may be exposed by the first opening 240.

In example embodiments, an area of a bottom of the first opening 240 may be greater than an area of the upper surface of the active pattern 105. Thus, the first opening 240 may also expose an upper surface of a portion of the isolation pattern 110 adjacent to the active pattern 105. Additionally, the first opening 240 may extend through upper portions of the active pattern 105 and the portion of the isolation pattern 110 adjacent thereto, and thus the bottom of the first opening 240 may be lower than an upper surface of each of opposite edge portions in the third direction D3 of the active pattern 105.

The bit line structure 395 may include a first conductive pattern 255, a first barrier pattern 265, a second conductive pattern 275, a first mask 285, a first etch stop pattern 365 and a first capping pattern 385 sequentially stacked in the vertical direction on the first opening 240 or the insulation pattern structure 235. The first conductive pattern 255, the first barrier pattern 265 and the second conductive pattern 275 may collectively form a conductive structure, and the first mask 285, the first etch stop pattern 365 and the first capping pattern 385 may collectively form an insulation structure.

The first conductive pattern 255 may include, e.g., doped polysilicon, the first barrier pattern 265 may include a metal nitride, e.g., titanium nitride, or a metal silicon nitride, e.g., titanium silicon nitride, the second conductive pattern 275 may include a metal, e.g., tungsten, and each of the first mask 285, the first etch stop pattern 365 and the first capping pattern 385 may include an insulating nitride, e.g., silicon nitride.

In example embodiments, the bit line structure 395 may extend in the second direction D2 on the substrate 100, and a plurality of bit line structures 395 may be spaced apart from each other in the first direction D1.

The spacer structure 460 may include first to third spacers 400, 435 and 450 sequentially stacked on a sidewall in the first direction D1 of the bit line structure 395. In example embodiments, the spacer structures 460 disposed on the opposite sidewalls, respectively, in the first direction D1 of the bit line structure 395 may be symmetrical with respect to the bit line structure 395. Accordingly, the first to third spacers 400, 435 and 450 included in the respective spacer structures 460 may be symmetrical with respect to the bit line structure 395.

Each of the first and the third spacers 400 and 450 may include an insulating nitride, e.g., silicon nitride, and the second spacer 435 may include an oxide, e.g., silicon oxide.

The insulation pattern structure 235 may be formed on the isolation pattern 110 under the bit line structure 395, and may include first, second and third insulation patterns 205, 215 and 225 sequentially stacked in the vertical direction. The first and third insulation patterns 205 and 225 may include an oxide, e.g., silicon oxide, and the second insulation pattern 215 may include an insulating nitride, e.g., silicon nitride.

The fourth and fifth insulation patterns 410 and 420 may be formed in the first opening 240, and may contact a lower sidewall of the bit line structure 395. The fourth insulation pattern 410 may include an oxide, e.g., silicon oxide, and the fifth insulation pattern 420 may include an insulating nitride, e.g., silicon nitride. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower contact plug 475, the metal silicide pattern 500 and the upper contact plug structure 620 may be sequentially stacked in the vertical direction on the active pattern 105 and the isolation pattern 110 to form a contact plug structure.

The lower contact plug 475 may contact an upper surface of each of opposite edge portions in the third direction D3 of the active pattern 105. In example embodiments, a plurality of lower contact plugs 475 may be spaced apart from each other in the second direction D2 between the bit line structures 395, and the second capping pattern 485 may be disposed between neighboring ones of the lower contact plugs 475 in the second direction D2. For example, the second capping pattern 485 may contact a sidewall of the lower contact plug 475. The lower contact plug 475 may include, e.g., doped polysilicon, and the second capping pattern 485 may include an insulating nitride, e.g., silicon nitride.

The metal silicide pattern 500 may include, e.g., titanium silicide, cobalt silicide, nickel silicide, etc.

The upper contact plug structure 620 may include a first upper contact plug 547 and a second upper contact plug 613 sequentially stacked in the vertical direction on the lower contact plug 475.

The first upper contact plug 547 may include a second metal pattern 545 and a second barrier pattern 535 covering a lower surface and a sidewall of the second metal pattern 545. The second metal pattern 545 may include a metal, for example, tungsten, and the second barrier pattern 535 may include a metal nitride, for example, titanium nitride.

In example embodiments, a plurality of first upper contact plugs 547 may be spaced apart from each other in the first direction D1 between the bit line structures 395, and the second capping pattern 485 may be disposed between ones of the first upper contact plugs 547 adjacent to each other in the second direction D2. For example, the second capping pattern 485 may contact a sidewall of the first upper contact plug 547.

In example embodiments, an upper surface of the first upper contact plug 547 may be coplanar with an upper surface of the bit line structure 395.

In example embodiments, the second barrier pattern 535 may not cover the upper surface of the bit line structure 395.

The second upper contact plug 613 may include third and fourth metal patterns 555 and 610 sequentially stacked in the vertical direction. Each of the third and fourth metal patterns 555 and 610 may include a metal, e.g., tungsten. In an example embodiment, the third and fourth metal patterns 555 and 610 may include a same metal, and thus, the third and fourth metal patterns 555 and 610 may be merged with each other to form an integrated structure. In another example embodiment, the third and fourth metal patterns 555 and 610 may include different metals from each other.

In example embodiments, the second upper contact plugs 613 may be spaced apart from each other in the first and second directions D1 and D2, and may be arranged in a honeycomb pattern or a lattice pattern in a plan view. Each of the upper contact plug structures 620 may have a shape of, e.g., a circle, an ellipse, or a polygon in a plan view.

The sixth insulation pattern 590 may cover a sidewall of the second upper contact plug 613, and may partially extend through upper portions of the first upper contact plugs 547, the bit line structures 395 and the spacer structures 460. The sixth insulation pattern 590 may include an insulating nitride, e.g., silicon nitride.

The second etch stop pattern 700 may be formed on the sixth insulation pattern 590. The second etch stop pattern 700 may include, an insulating nitride, e.g., silicon boronitride, silicon nitride, etc.

The capacitor 740 may include a lower electrode 710, a dielectric layer 720 and an upper electrode 730 that are sequentially stacked, and the lower electrode 710 may extend through the second etch stop pattern 700 to contact an upper surface of the upper contact plug structure 620.

Each of the lower electrode 710 and the upper electrode 730 may include, e.g., a metal, a metal nitride, a metal silicide, and the dielectric layer 720 may include, e.g., a metal oxide.

The upper contact plug structure 620 may include the first and second upper contact plugs 547 and 613 sequentially stacked in the vertical direction. As described below, a bridging phenomenon in which neighboring ones of the upper contact plug structures 620 are connected to each other and/or a necking phenomenon in which the first and second upper contact plugs 547 and 613 in each of the upper contact plug structures 620 are separated from each other may be alleviated or prevented, and thus, the semiconductor device including the upper contact plug structure 620 may have improved electrical characteristics.

Additionally, the bit line structure 395 included in the semiconductor device may have a low aspect ratio, and thus, the difficulty of manufacturing the semiconductor device may be reduced.

FIGS. 3 to 23 are plan views and cross-sectional views illustrating a method of manufacturing a semiconductor device according to example embodiments. Specifically, FIGS. 3, 5, 8, 12, 17 and 22 are the plan views, FIG. 4 includes cross-sectional views taken along lines A-A' and B-B', respectively, of FIG. 1, and FIGS. 6, 7, 9-11, 13-16, 18-21 and 23 are cross-sectional views taken along lines A-A', respectively, of corresponding plan views.

Referring to FIGS. 3 and 4, an upper portion of a substrate 100 may be removed to form a first recess, and an isolation pattern 110 may be formed in the first recess.

As the isolation pattern 110 is formed on the substrate 100, an active pattern 105 of which a sidewall is covered by the isolation pattern 110 may be defined.

The active pattern 105 and the isolation pattern 110 on the substrate 100 may be partially etched to form a second recess extending in the first direction D1, and a gate structure 160 may be formed in the second recess. In example embodiments, the gate structure 160 may extend in the first direction D1, and a plurality of gate structures may be spaced apart from each other in the second direction D2.

Referring to FIGS. 5 and 6, an insulating layer structure 230 may be formed on the active pattern 105, the isolation pattern 110, and the gate structure 160. The insulating layer structure 230 may include first to third insulating layers 200, 210, and 220 sequentially stacked.

The insulating layer structure 230 may be patterned, and the active pattern 105, the isolation pattern 110, and the gate mask 150 included in the gate structure 160 may be partially etched using the patterned insulating layer structure 230 as an etching mask to form a first opening 240. In example embodiments, the insulating layer structure 230 may have a circular shape or an elliptical shape in a plain view, and a plurality of insulating layer structures 230 may be spaced apart from each other in the first and second directions D1 and D2. Each of the insulating layer structures 230 may overlap, in the vertical direction, end portions of ones of the active patterns 105 neighboring in the third direction D3, which may face each other.

Figure 7:
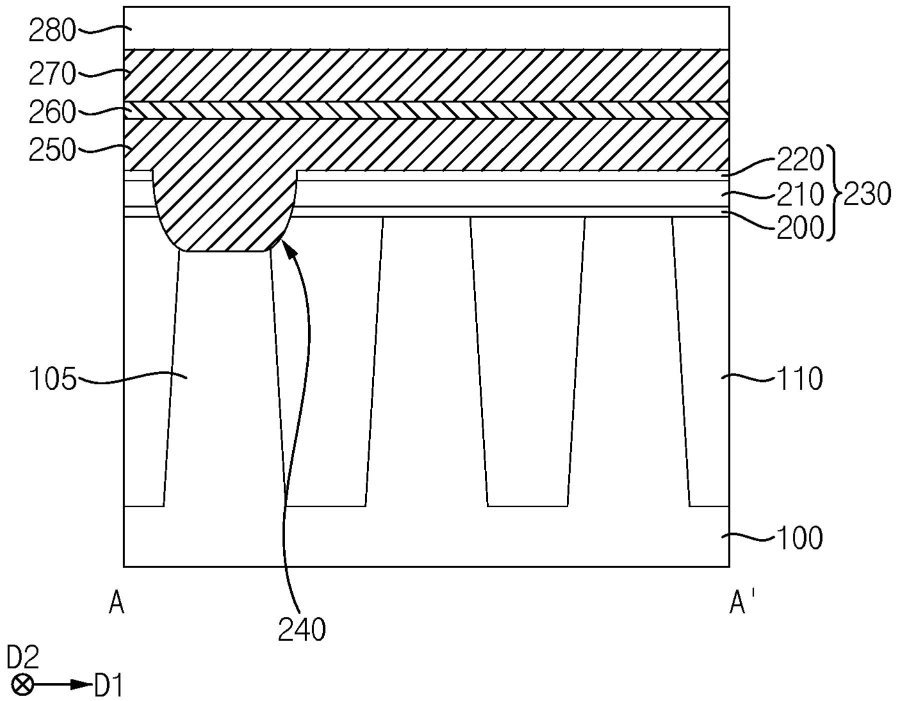

Referring to FIG. 7, a first conductive layer 250, a first barrier layer 260, a second conductive layer 270 and a first mask layer 280, which may collectively form a conductive structure layer, may be sequentially stacked on the insulating layer structure 230, and the active pattern 105, the isolation pattern 110 and the gate structure 160 exposed by the first opening 240. The first conductive layer 250 may fill the first opening 240.

Figure 8:
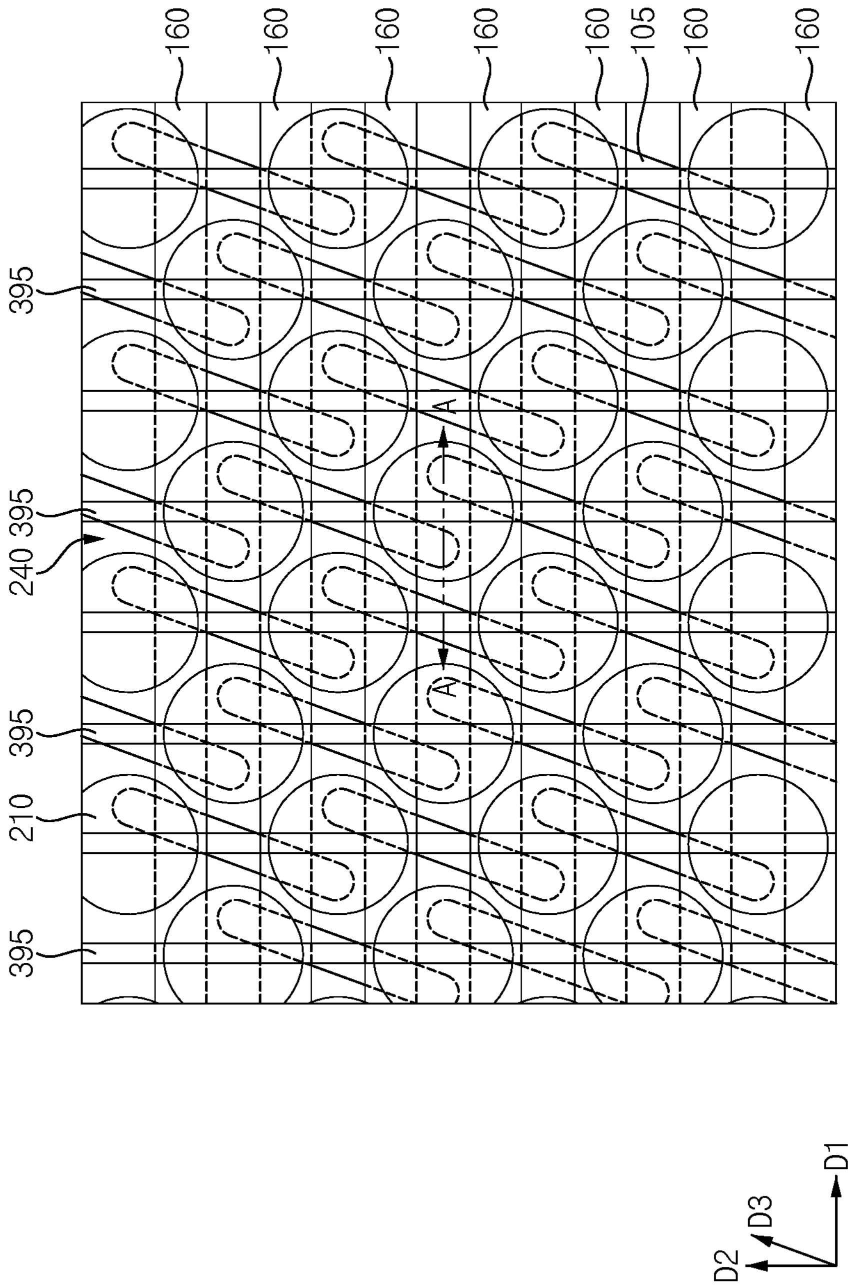
Figure 9:
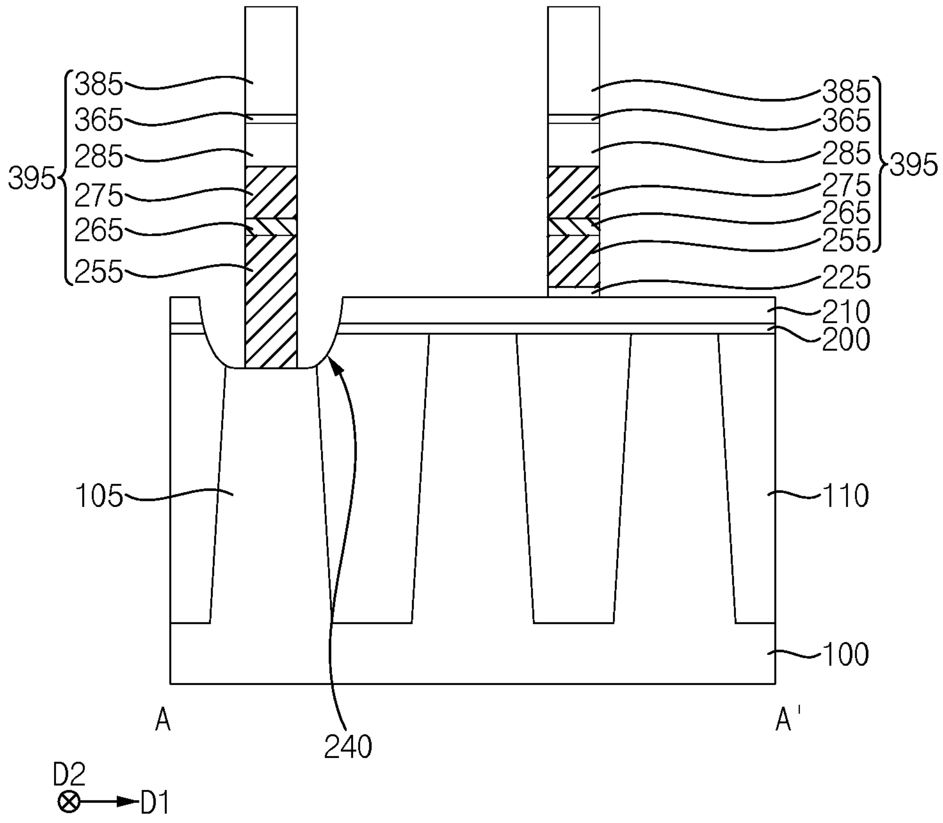

Referring to FIGS. 8 and 9, a first etch stop layer and a first capping layer may be sequentially formed on the conductive structure layer, the first capping layer may be etched to form the first capping pattern 385, and the first etch stop layer, the first mask layer 280, the second conductive layer 270, the first barrier layer 260 and the first conductive layer 250 may be sequentially etched using the first capping pattern 385 as an etch mask.

In example embodiments, the first capping pattern 385 may extend in the second direction D2, and a plurality of first capping patterns 385 may be spaced apart from each other in the first direction D1.

By the etching process, a first conductive pattern 255, a first barrier pattern 265, a second conductive pattern 275, a first mask 285, a first etch stop pattern 365 and the first capping pattern 385 may be formed on the first opening 240, and a third insulation pattern 225, the first conductive pattern 255, the first barrier pattern 265, the second conductive pattern 275, the first mask 285, the first etch stop pattern 365 and the first capping pattern 385 may be sequentially stacked on the second insulating layer 210 of the insulating layer structure 230 at an outside of the first opening 240.

Hereinafter, the first conductive pattern 255, the first barrier pattern 265, the second conductive pattern 275, the first mask 285, the first etch stop pattern 365 and the first capping pattern 385 sequentially stacked may be referred to as a bit line structure 395. The first conductive pattern 255, the first barrier pattern 265 and the second conductive pattern 275 may form a conductive structure, and the first mask 285, the first etch stop pattern 365 and the first capping pattern 385 may form an insulation structure. In example embodiments, the bit line structure 395 may extend in the second direction D2, and a plurality of bit line structures 395 may be spaced apart from each other in the first direction D1.

Figure 10:
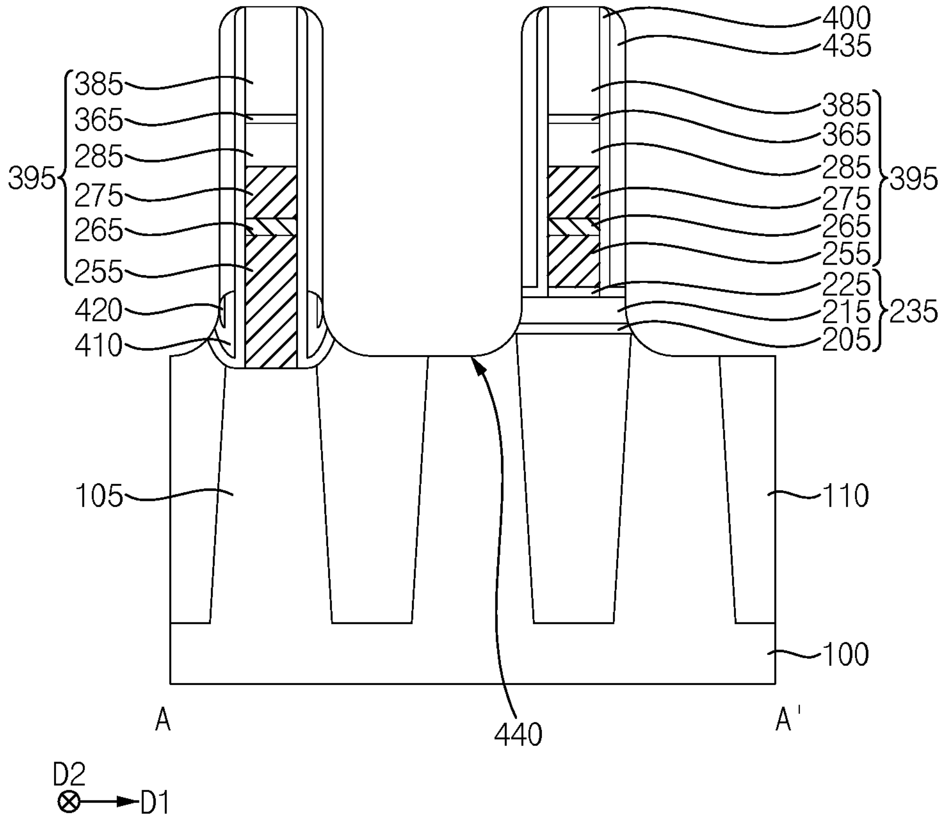

Referring to FIG. 10, a first spacer layer may be formed on the substrate 100 on which the bit line structure 395 is formed, and fourth and fifth insulating layers may be sequentially formed on the first spacer layer.

The first spacer layer may also cover a sidewall of the third insulation pattern 225 under the bit line structure 395 on the second insulating layer 210, and the fifth insulating layer may fill a remaining portion of the first opening 240.

The fourth and fifth insulating layers may be etched by an etching process. In example embodiments, the etching process may be a wet etching process using, e.g., phosphoric acid ($H_2PO_3$), SC1, and hydrofluoric acid (HF) as an etchant, and portions of the fourth and fifth insulating layers except for portions thereof in the first opening 240 may be removed. Accordingly, most portion of a surface of the first spacer layer, that is, all portions of the surface of the first spacer layer except for a portion of the surface thereof in the first opening 240 may be exposed, and the fourth and fifth insulating layers remaining in the first opening 240 may form the fourth and fifth insulation patterns 410 and 420, respectively.

A second spacer layer may be formed on the exposed surface of the first spacer layer and the fourth and fifth insulation patterns 410 and 420 in the first opening 240. The second spacer layer may be anisotropically etched to form the second spacer 435 covering a sidewall of the bit line structure 395 on the surface of the first spacer layer and on the fourth and fifth insulation patterns 410 and 420.

A dry etching process may be performed using the first capping pattern 385 and the second spacer 435 as an etch mask to form a second opening 440 exposing an upper surface of the active pattern 105, and upper surfaces of the isolation pattern 110 and the gate mask 150 may also be exposed by the second opening 440.

By the dry etching process, portions of the first spacer layer on upper surfaces of the first capping pattern 385 and the second insulating layer 210 may be removed, and thus a first spacer 400 may be formed on the sidewall of the bit line structure 395. By the dry etching process, the first and second insulating layers 200 and 210 may be partially removed to remain as first and second insulation patterns 205 and 215, respectively, under the bit line structure 395. The first to third insulation patterns 205, 215 and 225 sequentially stacked under the bit line structure 395 may form the insulation pattern structure 235.

Figure 11:
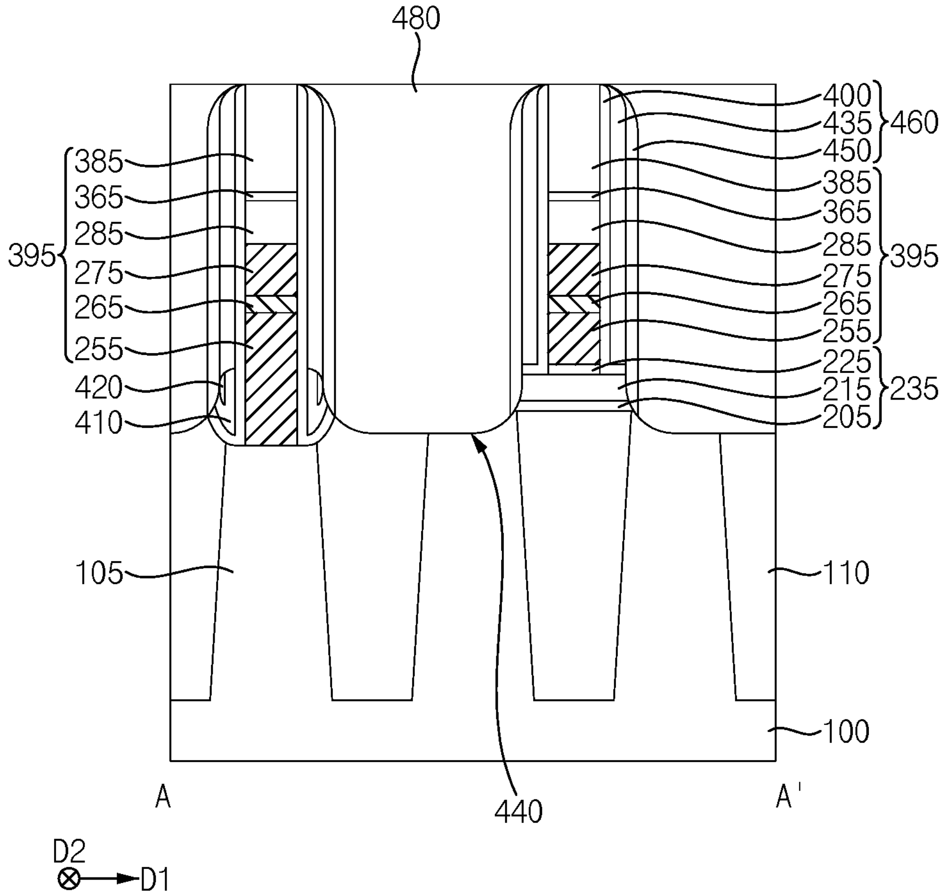

Referring to FIG. 11, a third spacer layer may be formed on an upper surface of the first capping pattern 385, an outer sidewall of the second spacer 435, portions of the upper surfaces of the fourth and fifth insulation patterns 410 and 420, and the upper surfaces of the active pattern 105, the isolation pattern 110 and the gate mask 150 exposed by the second opening 440. The third spacer layer may be anisotropically etched to form the third spacer 450 covering the sidewall of the bit line structure 395.

The first to third spacers 400, 435 and 450 sequentially stacked on the sidewall of the bit line structure 395 in the horizontal direction may be referred to as the spacer structure 460.

A first sacrificial layer may be formed to fill the second opening 440 on the substrate 100 to a sufficient height, and an upper portion of the first sacrificial layer may be planarized until the upper surface of the first capping pattern 385 is exposed to form a first sacrificial pattern 480 in the second opening 440.

In example embodiments, the first sacrificial pattern 480 may extend in the second direction D2, and a plurality of first sacrificial patterns 480 may be spaced apart from each other in the first direction D1 by the bit line structures 395. The first sacrificial pattern 480 may include, e.g., an oxide such as silicon oxide.

Figure 12:
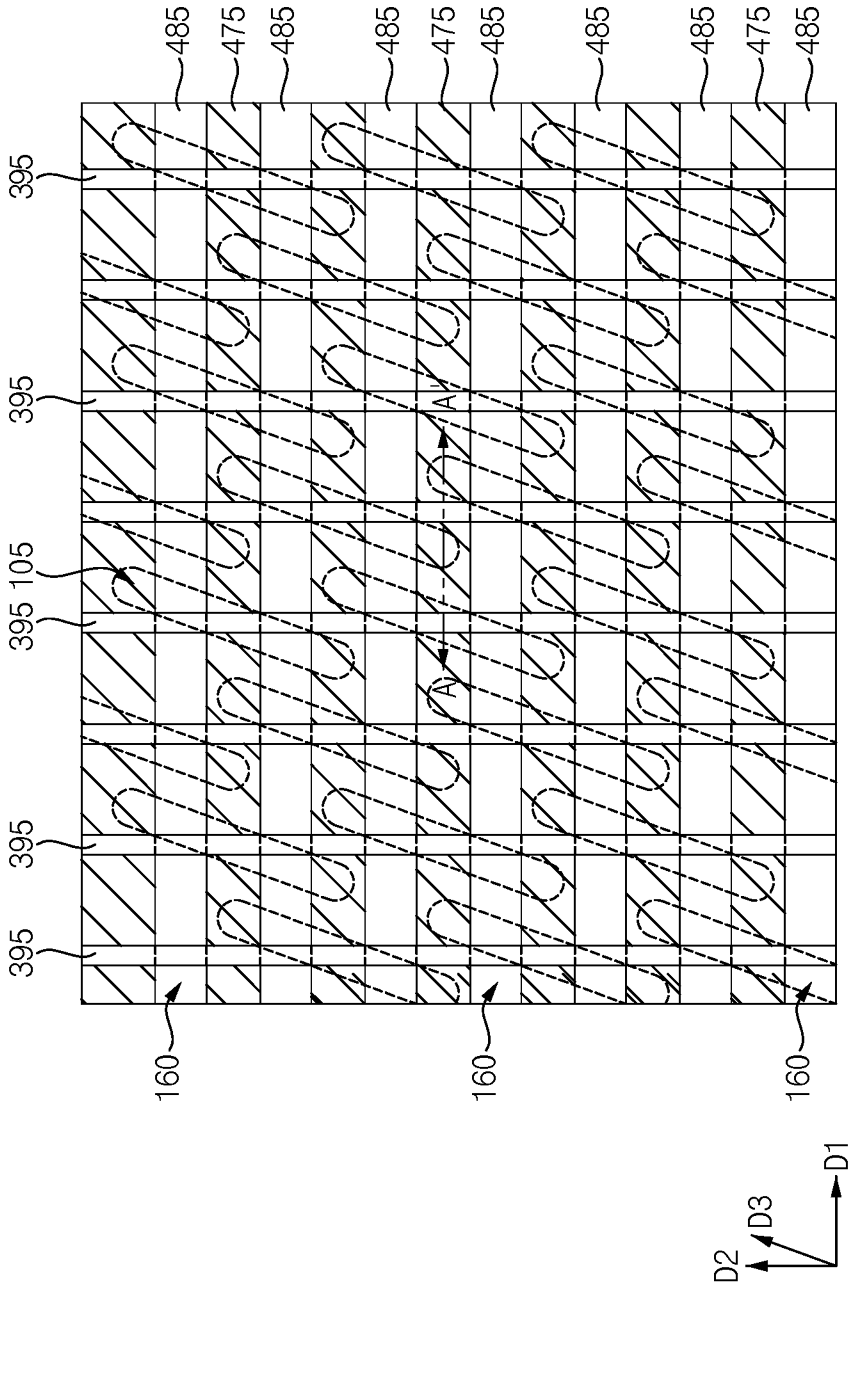
Figure 13:
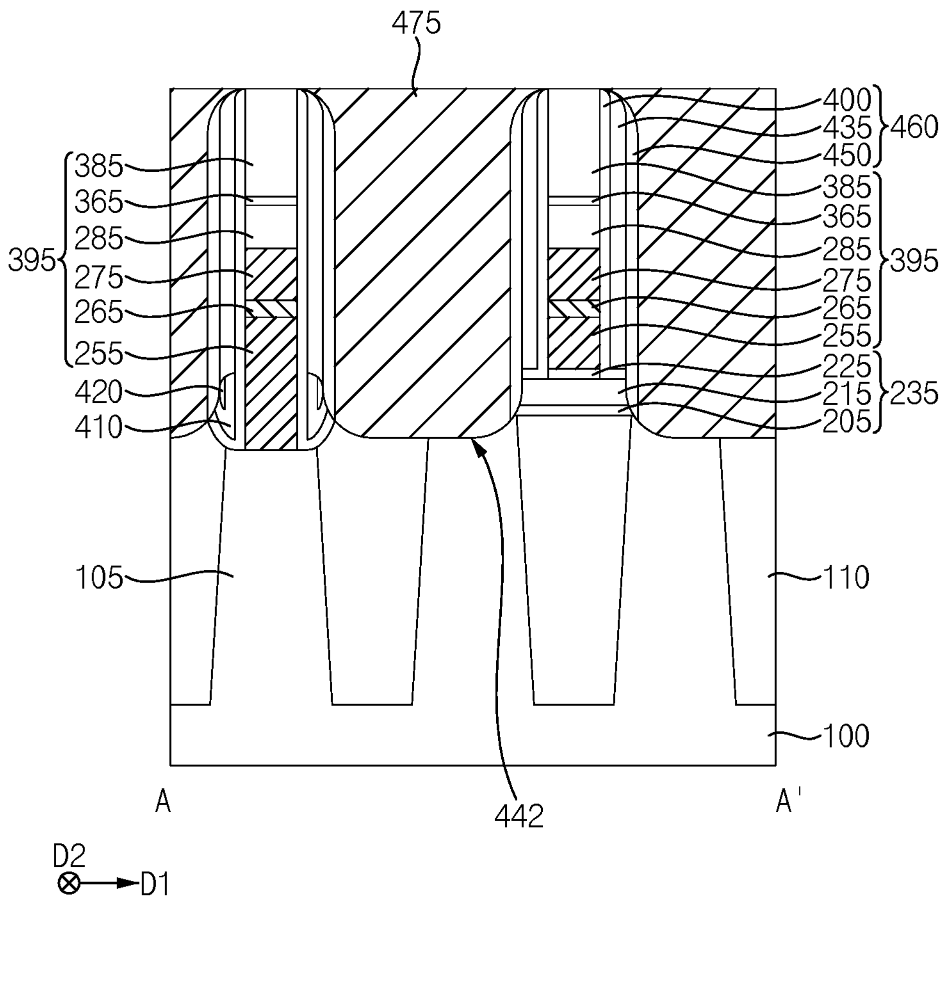

Referring to FIGS. 12 and 13, a second mask including a plurality of third openings, each of which may extend in the first direction D1, spaced apart from each other in the second direction D2 may be formed on the first capping pattern 385, the first sacrificial pattern 480 and the spacer structure 460, and the first sacrificial pattern 480 may be etched using the second mask as an etching mask.

In example embodiments, each of the third openings may overlap a region between the gate structures 160 in the vertical direction. By the etching process, a fourth opening 442 exposing the upper surfaces of the active pattern 105 and the isolation pattern 110 may be formed between the bit line structures 395 on the substrate 100.

The second mask may be removed, a lower contact plug layer may be formed to fill the fourth opening 442 to a sufficient height, and an upper portion of the lower contact plug layer may be planarized until the upper surface of the first capping pattern 385 and upper surfaces of the first sacrificial pattern 480 and the spacer structure 460 are exposed.

Accordingly, the lower contact plug layer may be transformed into a plurality of lower contact plugs 475 spaced apart from each other in the second direction D2 between the bit line structures 395. Additionally, the first sacrificial pattern 480 extending in the second direction D2 between the bit line structures 395 may be divided into a plurality of parts in the second direction D2 by the lower contact plugs 475.

The first sacrificial pattern 480 may be removed to form a fifth opening, and a second capping pattern 485 may be formed to fill the fifth opening. In example embodiments, the second capping pattern 485 may overlap the gate structure 160 in the vertical direction.

Figure 14:
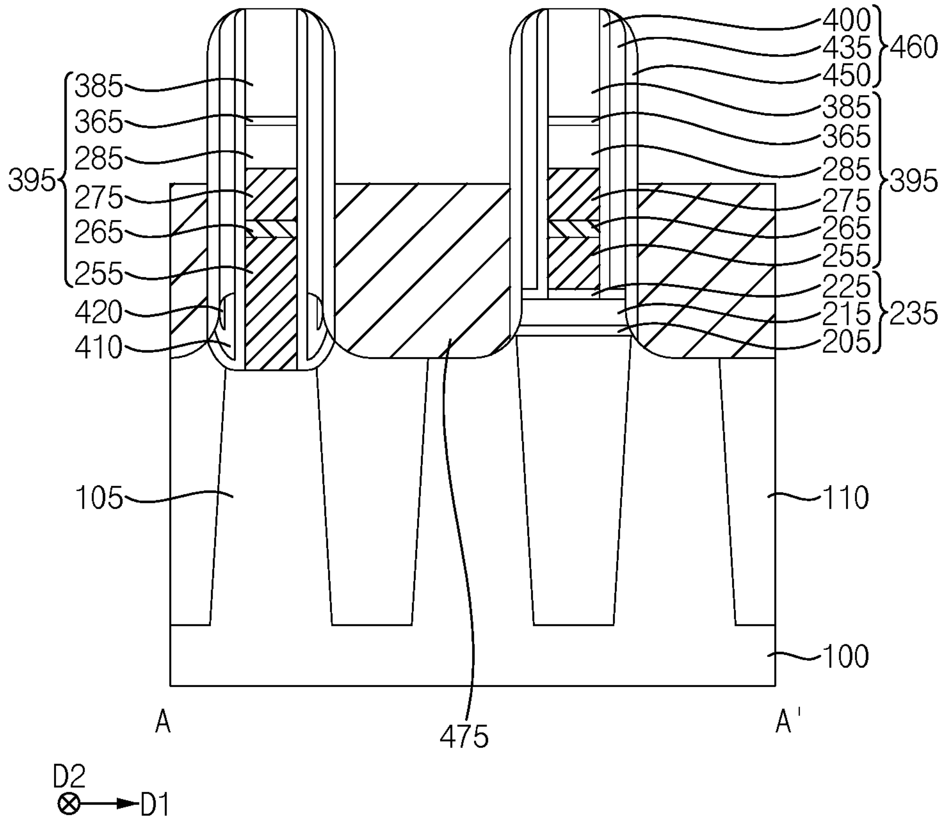

Referring to FIG. 14, an upper portion of the lower contact plug 475 may be removed by, e.g., an etch-back process.

In example embodiments, by the etch-back process, an upper surface of the lower contact plug 475 may be formed at a height between heights of an upper surface and a lower surface of the second conductive pattern 275.

Figure 15:
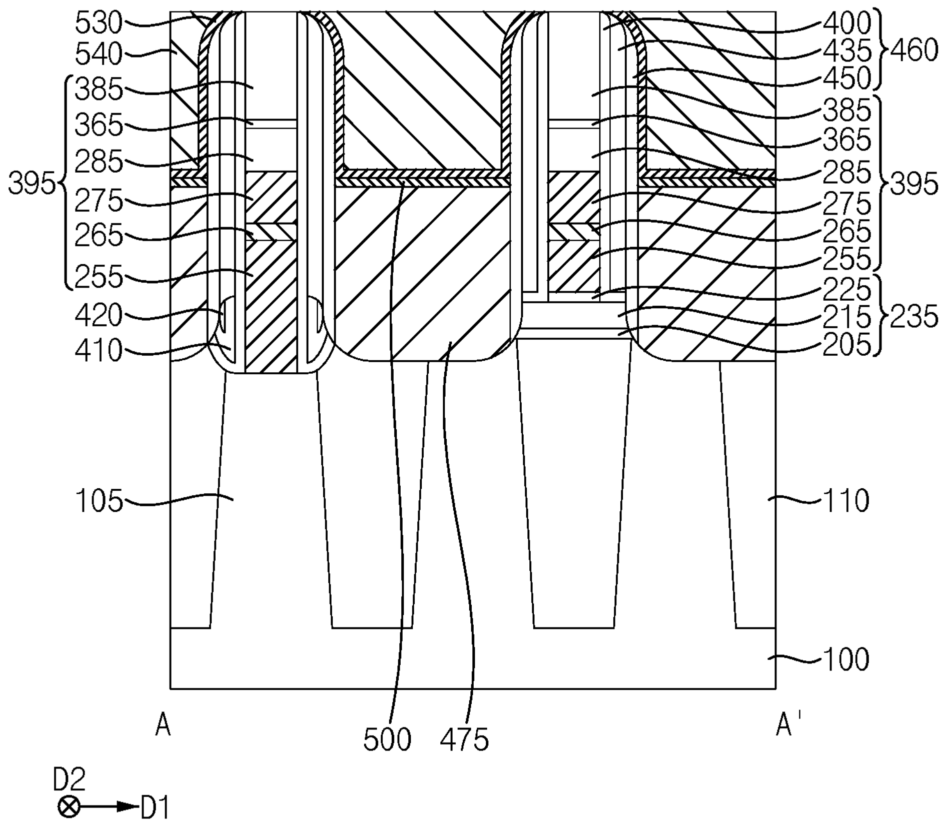

Referring to FIG. 15, a metal silicide pattern 500 may be formed on the exposed upper surface of the lower contact plug 475.

In example embodiments, the metal silicide pattern 500 may be formed by forming a first metal layer on the first and second capping patterns 385 and 485, the fourth spacer 460 and the lower contact plug 475, performing a heat treatment thereon, and removing an unreacted portion of the first metal layer.

A second barrier layer may be formed on the first and second capping patterns 385 and 485, the spacer structure 460, the metal silicide pattern 500 and the lower contact plug 475, and a second metal layer may be formed to fill a space between the bit line structures 395.

Upper portions of the second barrier layer and the second metal layer may be planarized until the upper surface of the first capping pattern 385 and an upper surface of the second capping pattern 385 and 485 are exposed. The planarization process may include, for example, a chemical mechanical polishing (CMP) process and/or an etch-back process.

Accordingly, the second barrier layer and the second metal layer may be transformed into a plurality of second preliminary barrier patterns 530 and a plurality of second preliminary metal patterns 540, respectively. The plurality of the second preliminary barrier patterns 530 may be spaced apart from each other in the second direction D2 between the bit line structures 395, and the plurality of the second preliminary metal patterns 540 may be spaced apart from each other in the second direction D2 between the bit line structures 395. The second preliminary barrier pattern 530 and the second preliminary metal pattern 540 may collectively form a first preliminary upper contact plug.

Figure 16:
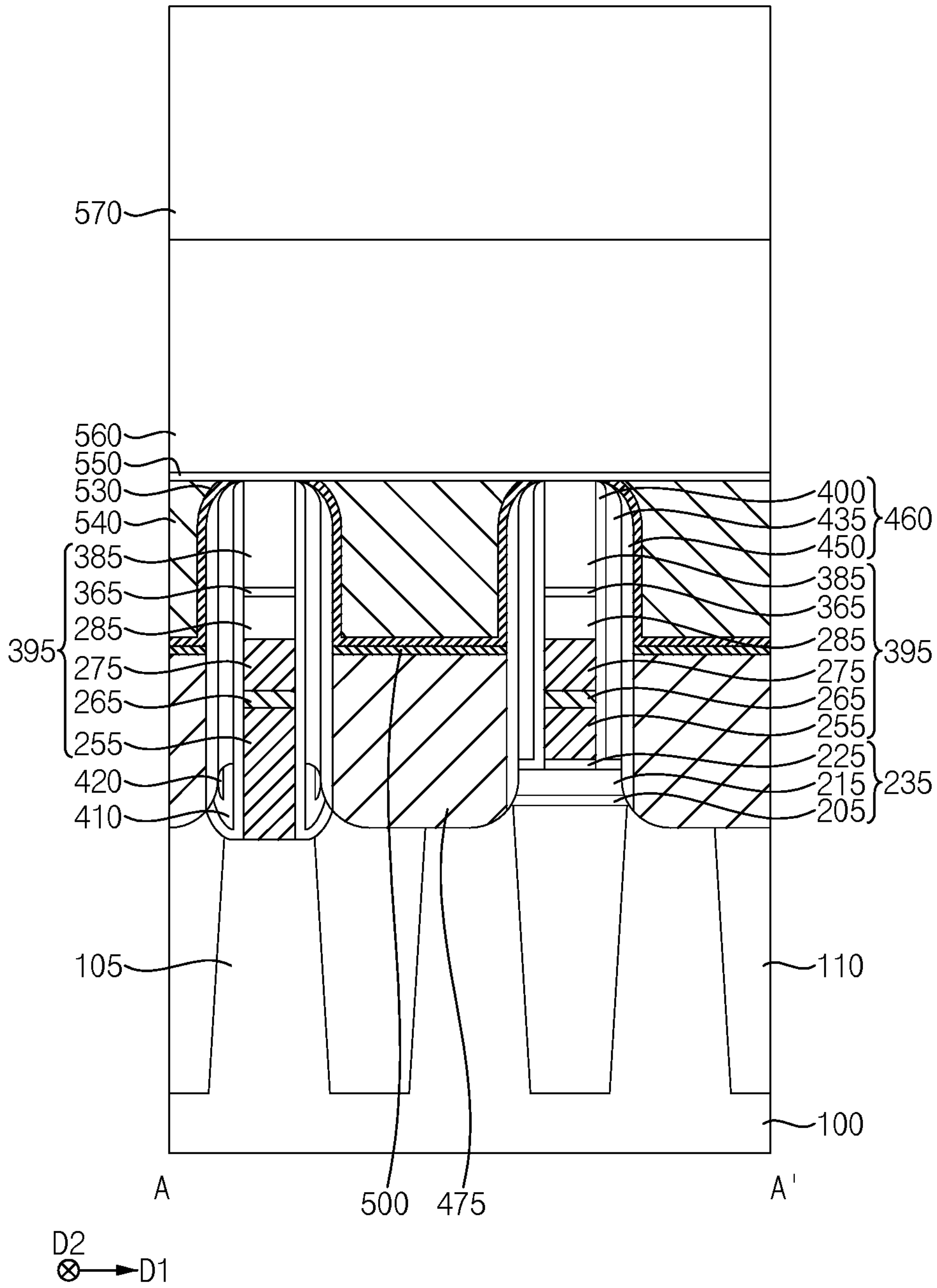

Referring to FIG. 16, a protection layer 550, a second sacrificial layer 560 and a third mask layer 570 may be sequentially formed on the first and second capping patterns 385 and 485, the spacer structure 460 and the first preliminary upper contact plug.

In example embodiments, the second sacrificial layer 560 may include, for example, an oxide such as silicon oxide, the protection layer 550 may include a material, for example, a metal such as tungsten, which may have a high etch selectivity with respect to a material included in the second sacrificial layer 560, and the third mask layer 570 may include, for example, amorphous carbon.

Figure 17:
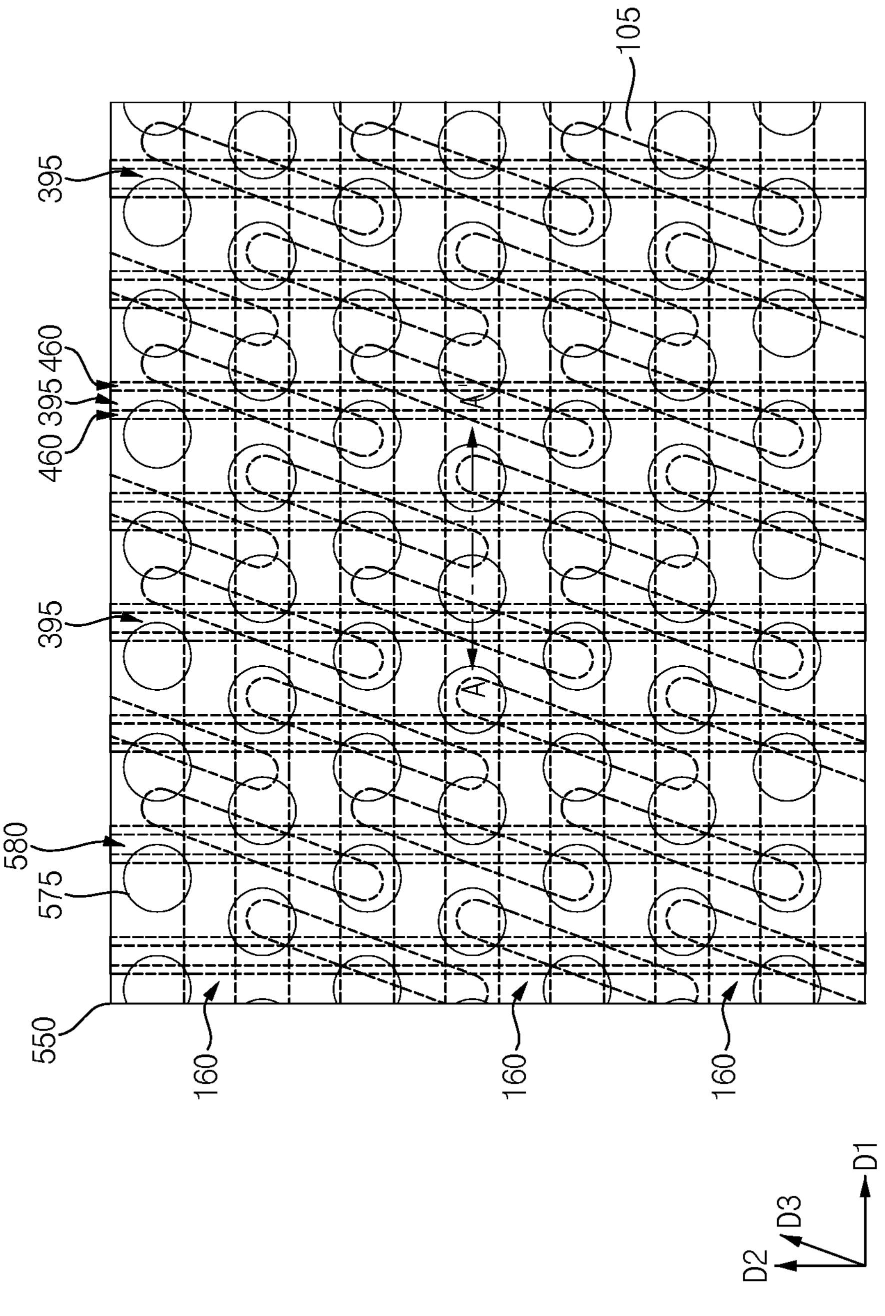
Figure 18:
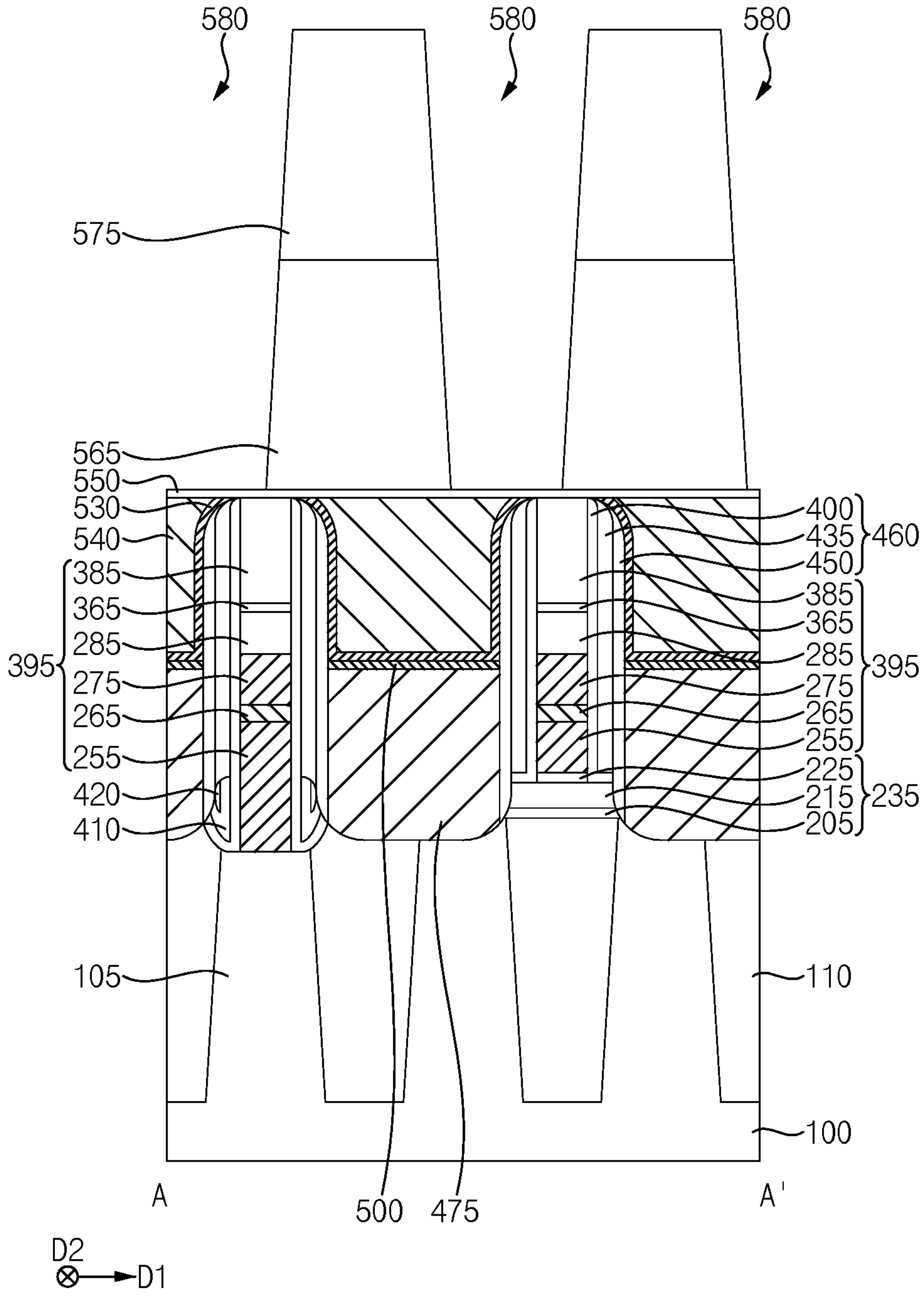

Referring to FIGS. 17 and 18, the third mask layer 570 may be etched to form a third mask 575 including a sixth opening, and the second sacrificial layer 560 may be etched by an etching process using the third mask 575 as an etch mask to form a seventh opening 580 partially exposing an upper surface of the protection layer 550. The second sacrificial layer 560 may be transformed to a second sacrificial pattern 565, and the protection layer 550 having a high etch selectivity with respect to the second sacrificial layer 560 may serve as a etch stop layer.

In example embodiments, the second sacrificial pattern 565 may have a shape of a circle, an ellipse, or a rounded polygon in a plan view, and the second sacrificial pattern 565 may be arranged, e.g., in a honeycomb pattern in the first and second directions D1 and D2.

Figure 19:
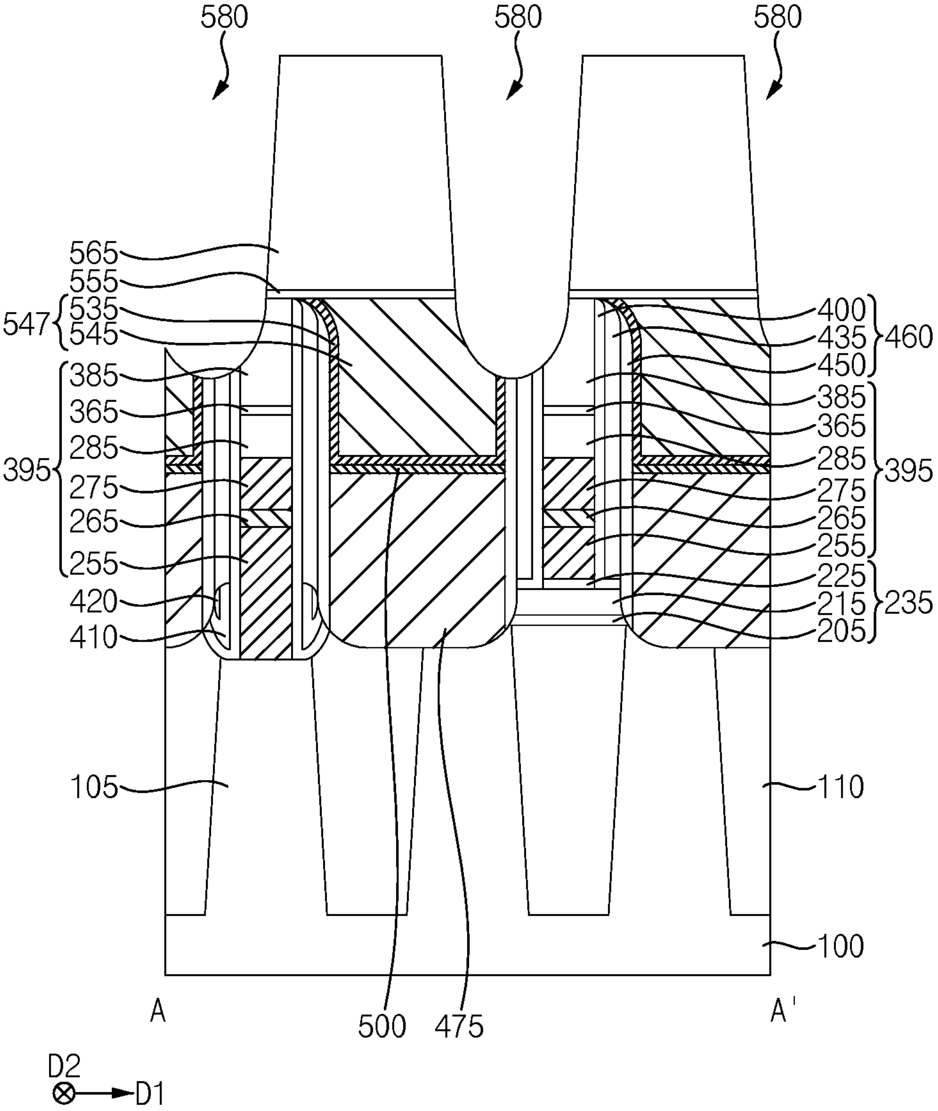

Referring to FIG. 19, a portion of the protection layer 550 exposed by the seventh opening 580 may be removed to form a protection pattern 555, and the first preliminary upper contact plug, the spacer structure 460 and the first and second capping patterns 385 and 485 may be partially exposed.

The protection pattern 555 may include a metal, and thus, may also be referred to as the third metal pattern 555.

Thereafter, not only the first preliminary upper contact plug, but also the first and second capping patterns 385 and 485 and the spacer structure 460 exposed by the seventh opening 580 may be partially removed, and the seventh opening 580 may be enlarged downwardly. The second preliminary metal pattern 540 and the second preliminary barrier pattern 530 may be transformed into a second metal pattern 545 and a second barrier pattern 535 covering a lower surface of the second metal pattern 545, respectively, and the second metal pattern 545 and the second barrier pattern 535 may collectively form a first upper contact plug 547.

In example embodiments, the second barrier pattern 535 may not cover the upper surface of the bit line structure 395.

Figure 20:
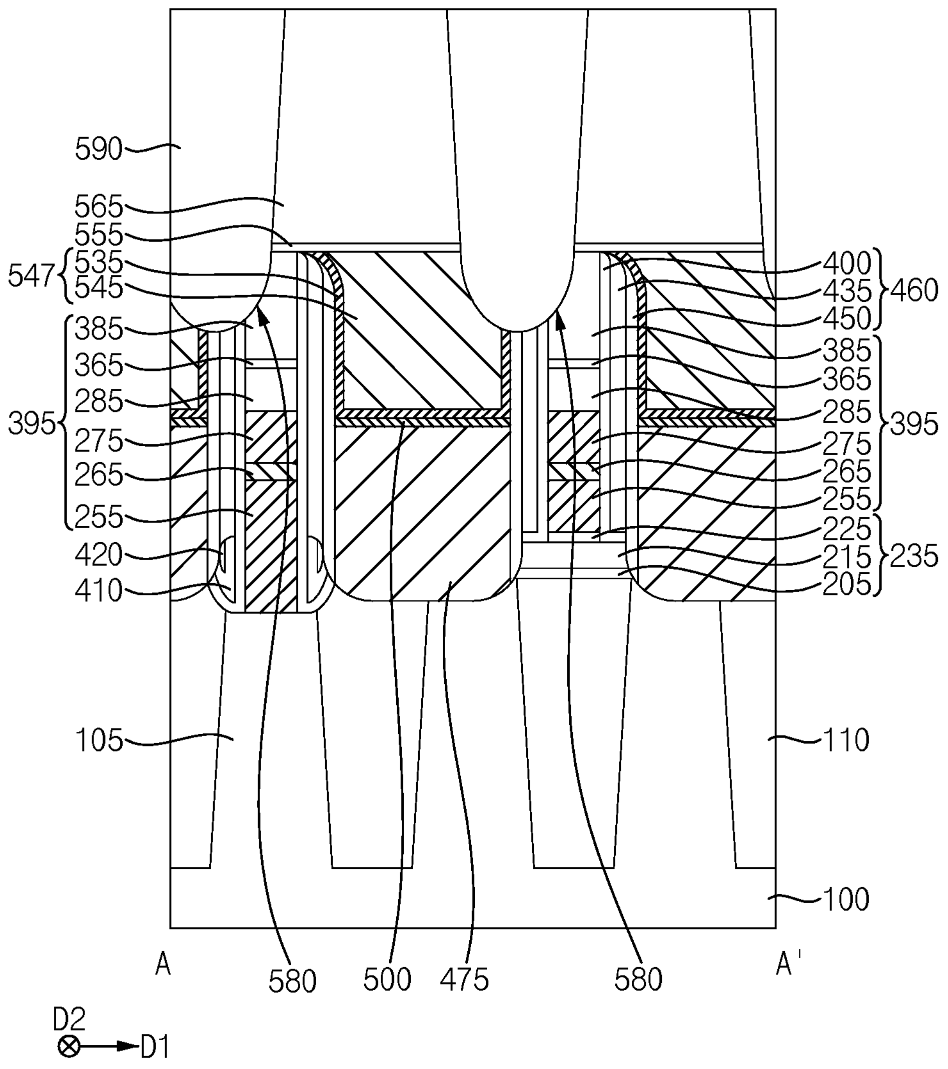

Referring to FIG. 20, the third mask 575 may be removed, and a sixth insulating layer may be formed on upper surfaces of the second barrier pattern 535 and the second metal pattern 545 exposed by the seventh opening 580, a sidewall of the third metal pattern 555, and a sidewall and an upper surface of the second sacrificial pattern 565 to fill the seventh opening 580, and the sixth insulating layer may be planarized until an upper surface of the second sacrificial pattern 565 is exposed.

The planarization process may include, for example, a chemical mechanical polishing (CMP) process and/or an etch-back process.

Figure 21:
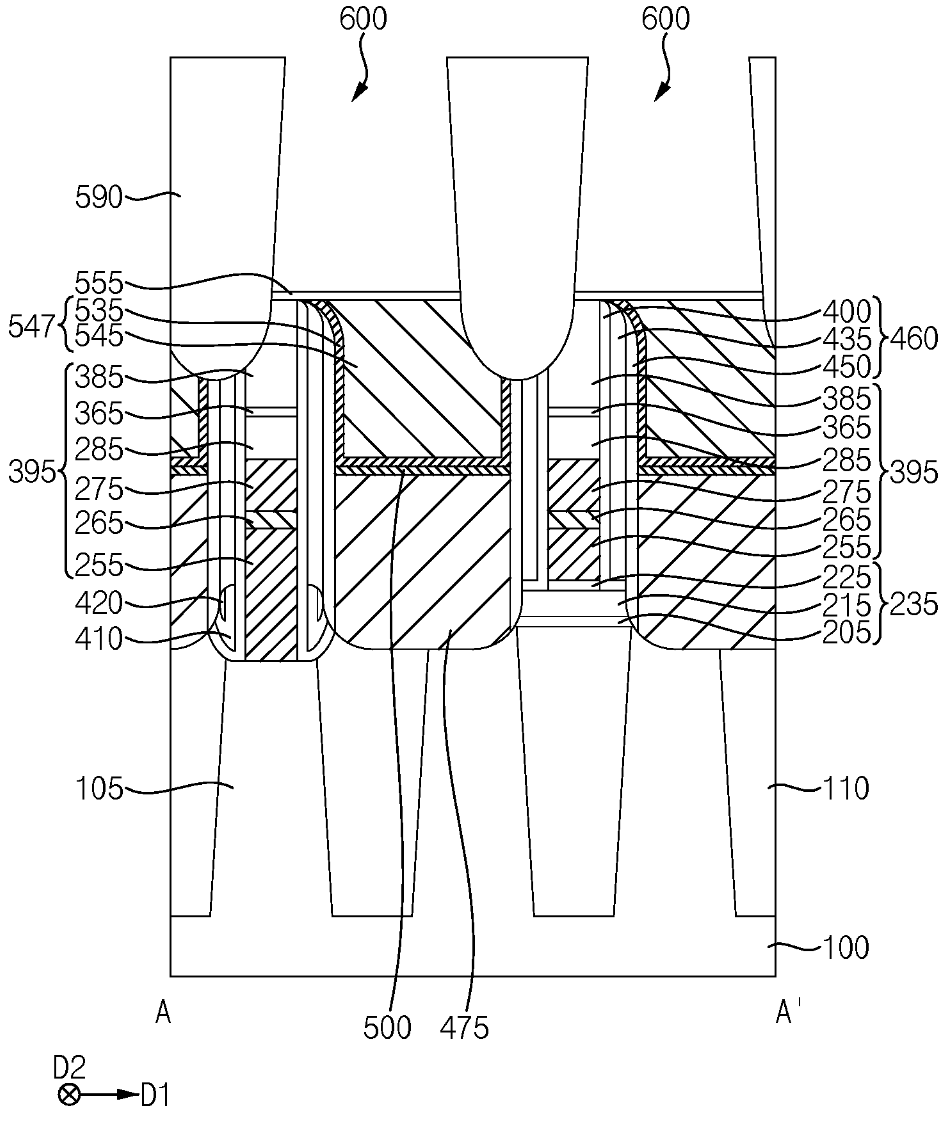

Referring to FIG. 21, the second sacrificial pattern 565 may be removed to form an eighth opening 600 exposing an upper surface of the third metal pattern 555 and a sidewall of the sixth insulation pattern 590.

In example embodiments, the second sacrificial pattern 565 may be removed by a wet etching process and/or a dry etching process. The third metal pattern 555 may have a high etch selectivity with respect to the second sacrificial pattern 565, and may serve as an etch stop layer during the etching process.

Figure 22:
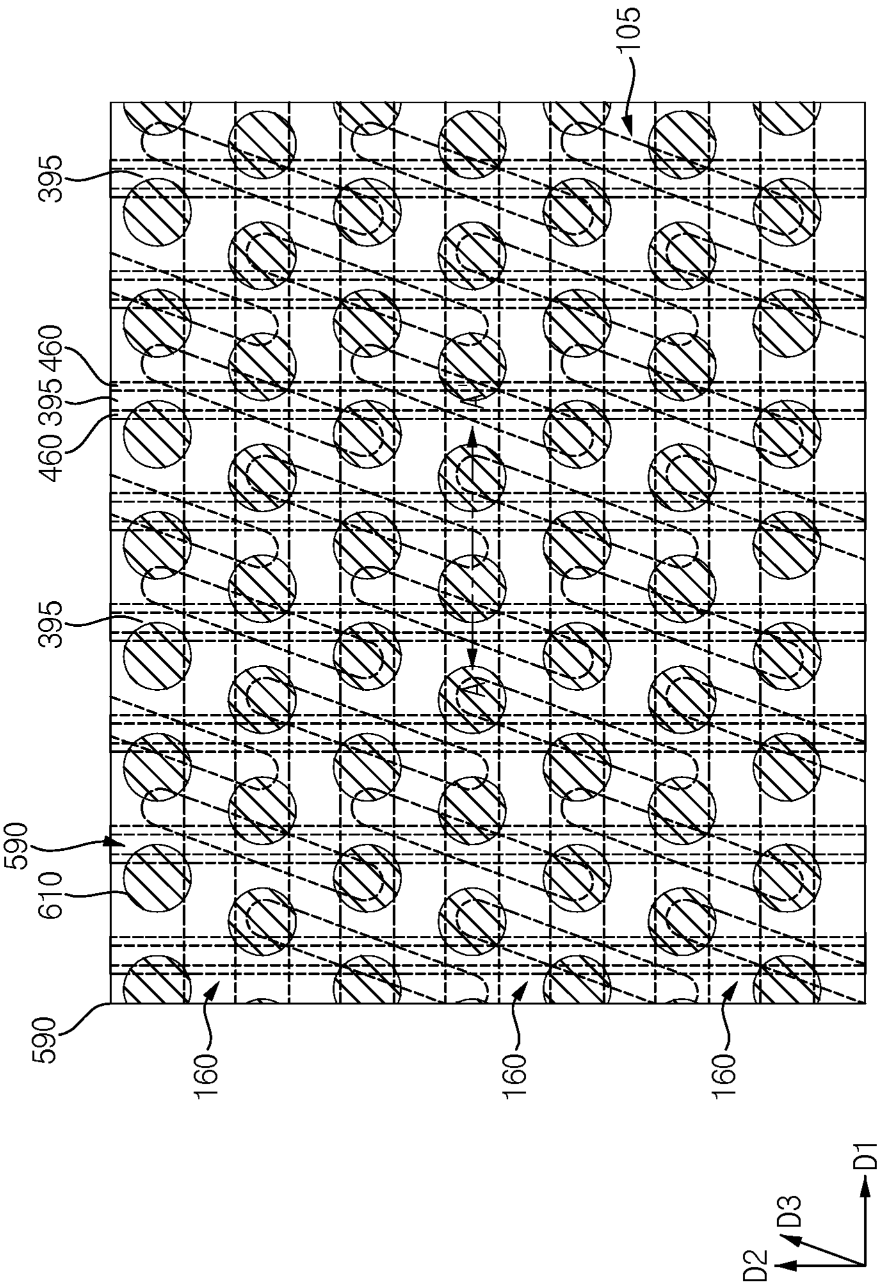
Figure 23:
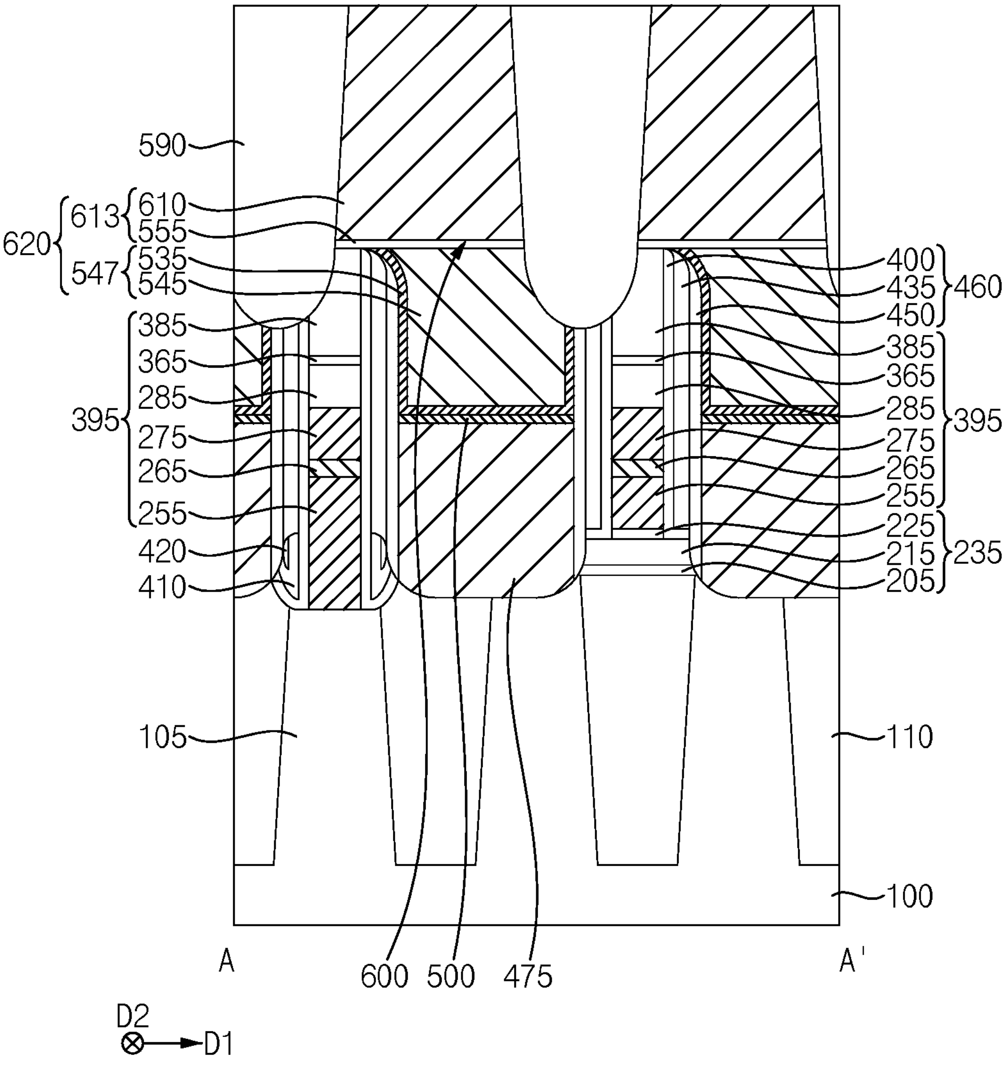

Referring to FIGS. 22 and 23, a fourth metal pattern 610 may be formed in the eighth opening 600.

In example embodiments, the fourth metal pattern 610 may be formed on the upper surface of the third metal pattern 555, and the sidewall and the upper surface of the sixth insulation pattern 590 exposed by the eighth opening, and an upper portion of the fourth metal pattern 610 may be planarized until an upper surface of the sixth insulation pattern 590 is exposed.

The planarization process may include, for example, a chemical mechanical polishing (CMP) process and/or an etch-back process.

The fourth metal pattern 610 and the third metal pattern 555 may collectively form a second upper contact plug 613. In example embodiments, the second upper contact plug 613 may have a shape of a circle, an ellipse, or a rounded polygon in a plan view, which may correspond to the shape of the second sacrificial pattern 565, and the second sacrificial pattern 565 may be arranged, e.g., in a honeycomb pattern in the first and second directions D1 and D2.

The first upper contact plug 547 including the second metal pattern 545 and the second barrier pattern 535 covering the lower surface of the second metal pattern 545, and the second upper contact plug 613 including the third and fourth metal patterns 555 and 610 sequentially stacked on the first upper contact plug 547 may collectively form an upper contact plug structure 620.

Referring back to FIGS. 1 and 2, a second etch stop pattern 700 and a mold layer may be sequentially formed on the sixth insulation pattern 590 and the upper contact plug structure 620, a ninth opening may be formed through the mold layer and the second etch stop pattern 700 to expose an upper surface of the upper contact plug structure 620, and a lower electrode 710 may be formed in the ninth opening.

The mold layer may be removed, and a dielectric layer 720 and an upper electrode 730 may be sequentially formed on the lower electrode 710 and the second etch stop pattern 700. Accordingly, a capacitor 740 including the lower electrode 710, the dielectric layer 720 and the upper electrode 730 may be formed, and the manufacturing of the semiconductor device may be completed.

As described above, in the method of manufacturing the semiconductor device according to example embodiments, the first preliminary upper contact plug may be formed on the lower contact plug 475, the protection layer 550 and the second sacrificial layer 560 may be sequentially formed on the first preliminary upper contact plug, the second sacrificial layer 560 may be etched by performing the etching process using the protection layer 550 as an etch stop layer to form the seventh opening 580, and the first preliminary upper contact plug may be etched through the seventh opening 580 to form the first upper contact plug 547. Thereafter, the sixth insulation pattern 590 may be formed in the seventh opening 580, and the fourth metal pattern 610 of the second upper contact plug 613 may be formed in the eighth opening 600 that may be formed by removing the remaining second sacrificial pattern 565. The protection pattern (or, the third metal pattern) 555 and the fourth metal pattern 610 may collectively form the second upper contact plug 613, and first and second upper contact plugs 547 and 613 may collectively form the upper contact plug structure 620.

If an upper contact plug is formed by forming a metal layer on the lower contact plug 475 and patterning the metal layer, the metal layer should be patterned to an appropriate depth to prevent a bridging phenomenon in which neighboring ones of the upper contact plugs are not separated from each other and/or a necking phenomenon in which lower and upper portions of the upper contact plug are separated from each other. However, controlling the pattering process may be difficult since a significant amount of the metal layer needs to be removed, and thus, the dispersion of shapes of the upper contact plugs may be great. In addition, in order to prevent the conductive structure included in the bit line structure 395 from being exposed by the patterning process, the first capping pattern 385 must be thick, and thus an aspect ratio of the bit line structure 395 including the first capping pattern 385 may be increased.

Accordingly, the difficulty of the processes of forming the bit line structure 395 and the processes of forming the lower contact plug 475 between the bit line structures 395 may increase, and electrical characteristics may deteriorate due to the large dispersion of the shapes of the upper contact plugs. In addition, if the patterning process is not sufficiently performed, the metal layer remaining after the patterning process may cause an electrical short between the neighboring ones of the upper contact plugs.

However, in the method of manufacturing a semiconductor device according to example embodiments, the first upper contact plug 547 may be formed by patterning the first preliminary upper contact plug, and the fourth metal pattern 610 of the second upper contact plug 613 may be formed to fill the eighth opening 600 that may be formed by removing the second sacrificial pattern 565 on the first upper contact plug 547.

For example, instead of forming the upper contact plug by a single positive patterning process of the metal layer, the upper contact plug structure 620 may be formed by two steps; i) forming the first upper contact plug 547 and ii) forming the second upper contact plug 613 on the first upper contact plug 547. Thus, an amount of the first preliminary upper contact plug that may be etched by a single etching process, particularly, by the etching process of the first preliminary upper contact plug may be small. Accordingly, the difficulty of the processes of forming the first upper contact plugs 547 may be reduced, the shape dispersion of the first upper contact plugs 547 may be improved, and the first capping pattern 385 may be formed to have a relatively small thickness. In addition, before enlarging the seventh opening 580 downwardly, the protection layer 550 may be used as an etch stop layer when forming the seventh opening 580, and thus the shape dispersion of the first upper contact plugs 547 may be additionally improved.

Furthermore, the fourth metal pattern 610 of the second upper contact plug 613 on the first upper contact plug 547 may be formed by forming the fourth metal layer in the eighth opening 600, which may be formed by removing the second sacrificial pattern 565, and planarizing the fourth metal layer. For example, the fourth metal pattern 610 may be formed by a damascene process instead of a positive patterning process. Thus, electrical short caused by a conductive material remaining between adjacent ones of the second upper contact plugs 613 may be prevented.

Figure 24:
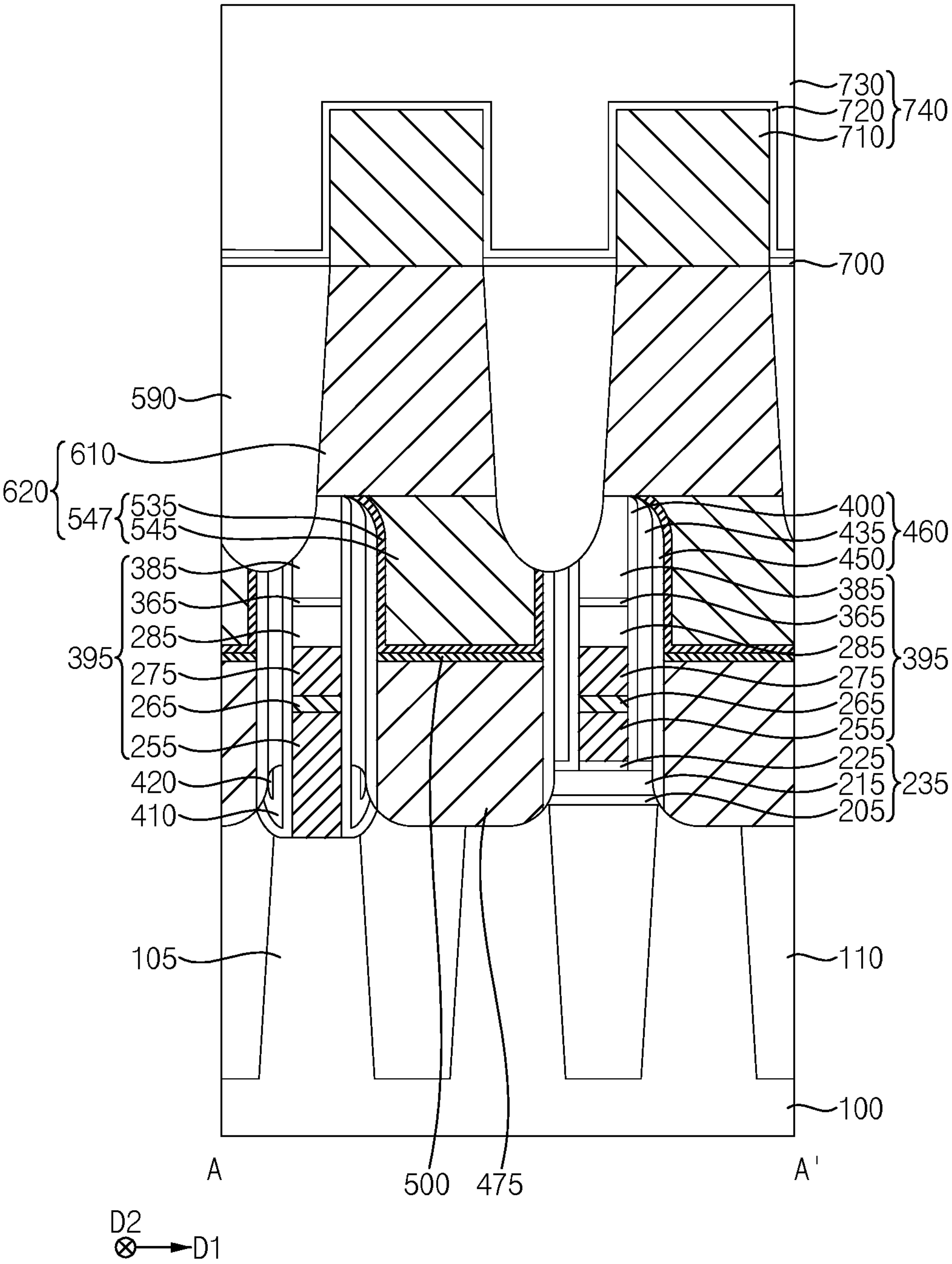
FIG. 24 is a cross-sectional view, respectively, illustrating a semiconductor device according to example embodiments.

FIG. 24 is a cross-sectional view illustrating a semiconductor device in accordance with example embodiments, which corresponds to FIG. 2.

This semiconductor device may be substantially the same as or similar to that of FIGS. 1 and 2, except for including only the fourth metal pattern 610 instead of the second upper contact plug 613 having the third and fourth metal patterns 555 and 610, and thus repeated explanations are omitted herein.

In example embodiments, the fourth metal pattern 610 may contact an upper surface of the first upper contact plug 547 including the second barrier pattern 535 and the second metal pattern 545.

Figure 25:
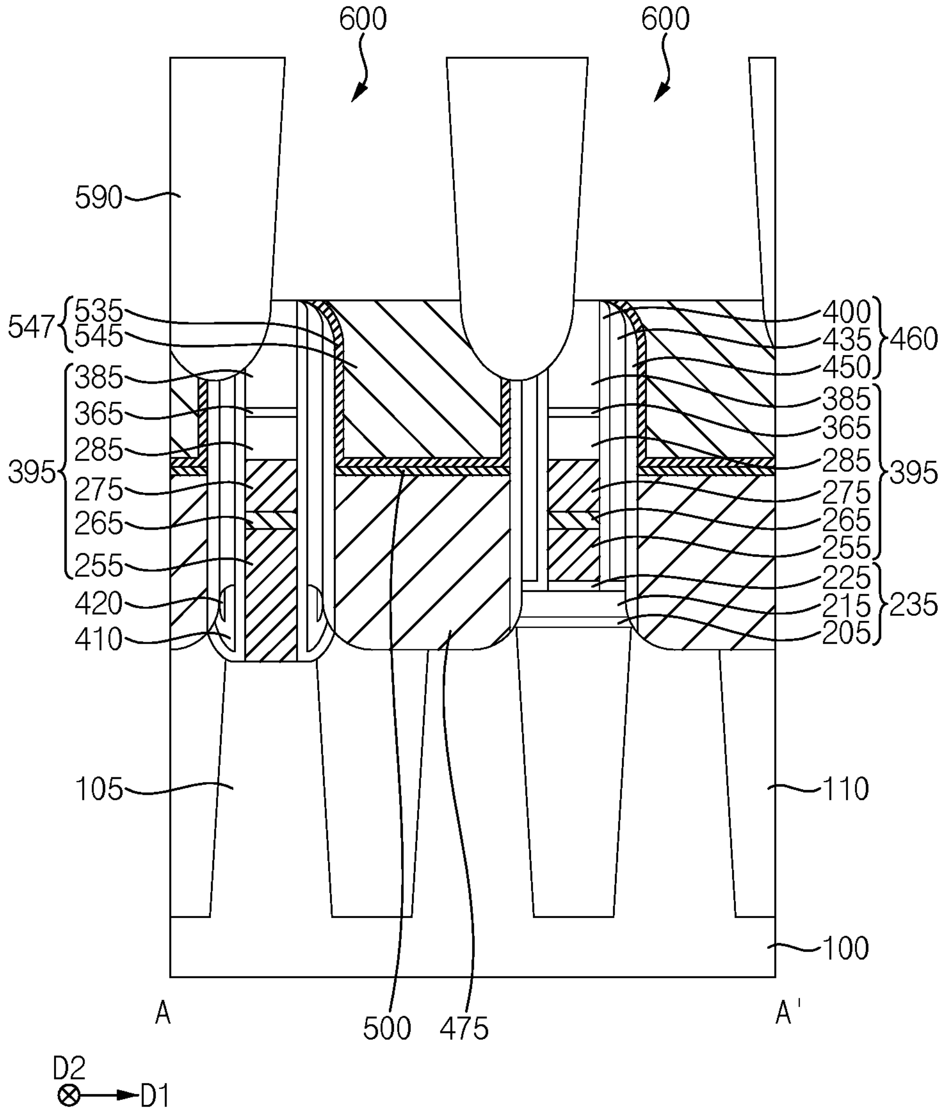
FIG. 25 is a cross-sectional view illustrating a method of manufacturing a semiconductor device according to example embodiments.

FIG. 25 is a cross-sectional view illustrating a method of manufacturing the semiconductor device. This method of manufacturing the semiconductor device may include processes substantially the same as or similar to those of FIGS. 1 to 23, and thus repeated explanations thereof are omitted herein.

Referring to FIG. 25, processes substantially the same as or similar to those of FIGS. 3 to 20 may be performed. However, the protection pattern 555 may include an insulating nitride, for example, silicon nitride instead of a metal, and thus may be referred to as a seventh insulation pattern 555.

After removing the second sacrificial pattern 565 by performing the processes described with reference to FIG. 21, the seventh insulation pattern 555 exposed by the eighth opening 600 may be further removed.

Thereafter, manufacturing of the semiconductor device may be completed by performing processes substantially the same as or similar to those of FIGS. 22 and 23.

Figure 26:
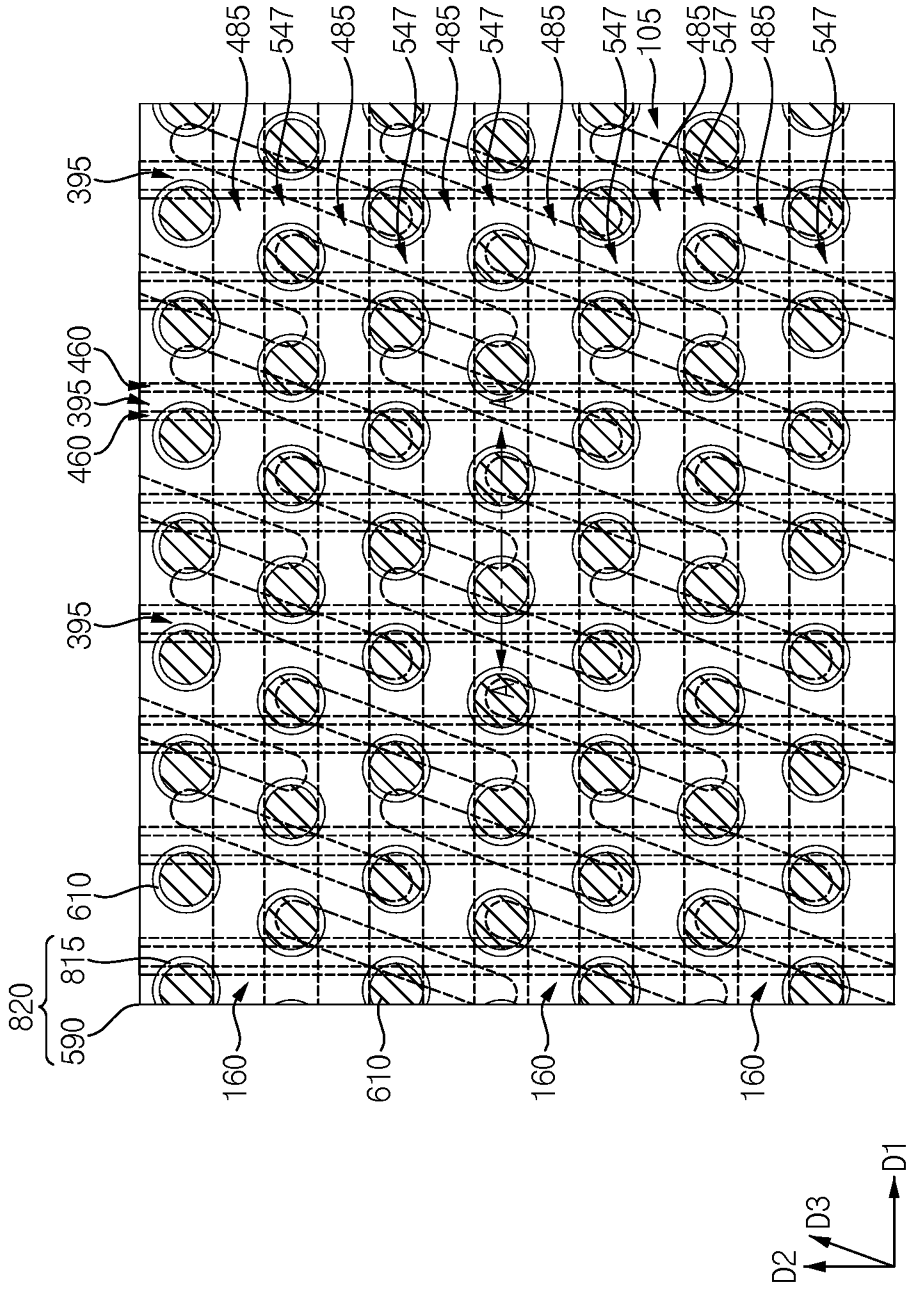
FIGS. 26 and 27 are a plan view and a cross-sectional view, respectively, illustrating a semiconductor device according to example embodiments.
Figure 27:
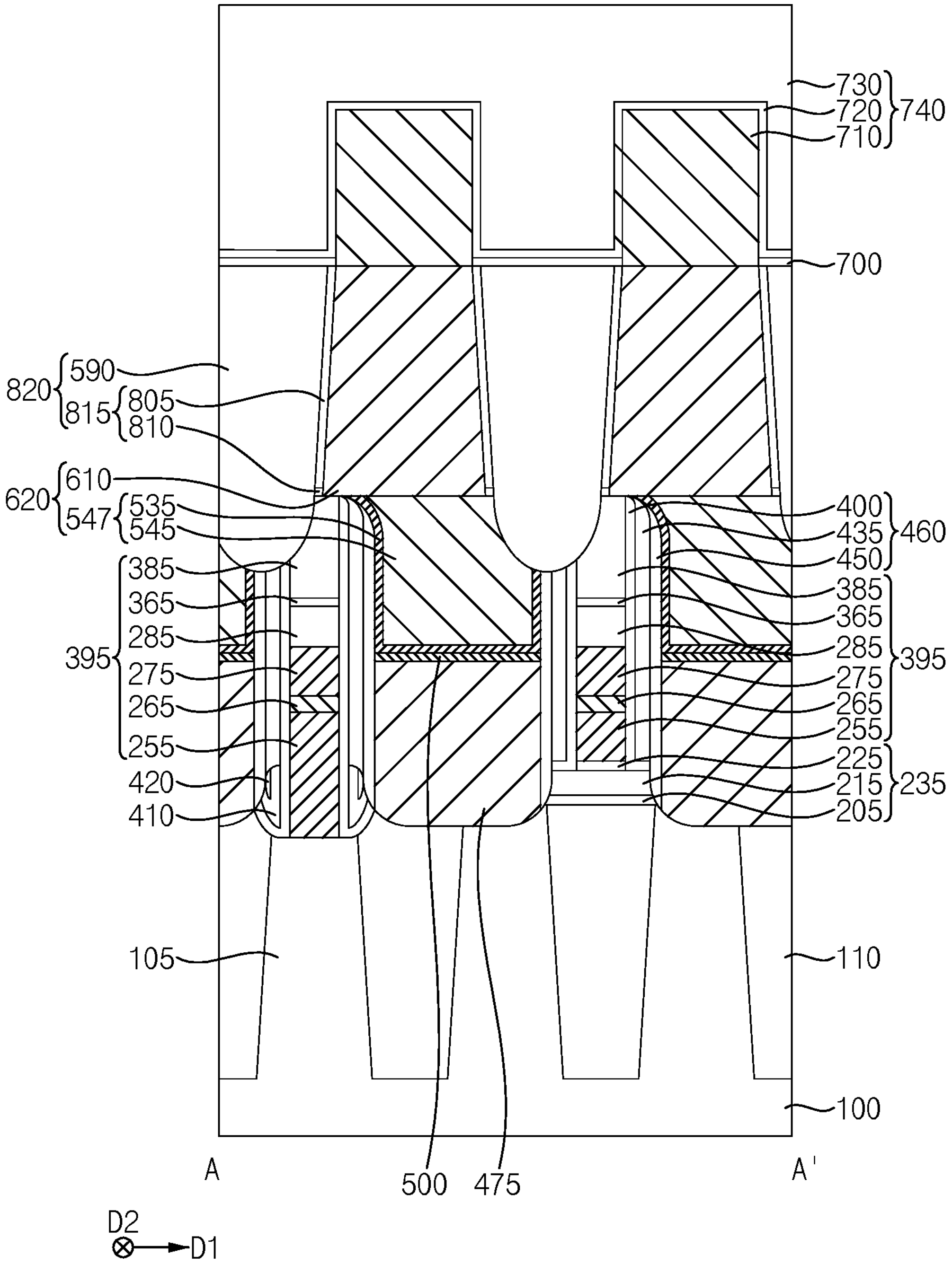

FIGS. 26 and 27 are a plan view and a cross-sectional view, respectively, illustrating a semiconductor device in accordance with example embodiments, which may correspond to FIGS. 1 and 2, respectively. The capacitor 740 and the second etch stop pattern 700 are not shown in FIG. 26 to avoid complexity.

This semiconductor device may be substantially the same as or similar to that of FIGS. 1 and 2, except for including only the fourth metal pattern 610 instead of the second upper contact plug 613 having the third and fourth metal patterns 555 and 610, and further including an insulating spacer structure 815, and thus repeated explanations are omitted herein.

Referring to FIGS. 26 and 27, the insulating spacer structure 815 may be formed on an upper sidewall of the sixth insulation pattern 590, and may be disposed between the fourth metal pattern 610 and the sixth insulation pattern 590. The insulating spacer structure 815 may include first and second insulating spacers 810 and 805 sequentially stacked on the upper surfaces of the first and second capping patterns 385 and 485 and the first upper contact plug 547.

In example embodiments, each of the first and second insulating spacers 810 and 805 may include an insulating nitride, for example, silicon nitride. In an example embodiment, the first and second insulating spacers 810 and 805 may include the same material, and thus may be merged with each other to form an integrated structure. In another example embodiment, the first and second insulating spacers 810 and 805 may include different insulating materials from each other.

The first and second insulating spacers 810 and 805 and the sixth insulation pattern 590 may collectively form a first insulation pattern structure 820.

In example embodiments, a sidewall (hereinafter, referred to as a first sidewall) of a portion of the second metal pattern 545 that contacts the first insulation pattern structure 820, and a sidewall (hereinafter, referred to as a second sidewall) of a portion of the fourth metal pattern 610 on an upper surface of the second metal pattern 545 and contacting the first insulation pattern structure 820 may not be aligned with each other in the vertical direction, and the first sidewall of the second metal pattern 545, the upper surface of the second metal pattern 545 adjacent to the first sidewall and the second sidewall of the fourth metal pattern 610 may collectively form a staircase shape.

As described below, a distance between the neighboring ones of the upper contact plug structures 620 including the first upper contact plug 547 and the fourth metal pattern 610, may be adjusted by a thickness in the horizontal direction of the insulating spacer structure 815. Thus, the process margin for avoiding the bridging phenomenon that may occur between the neighboring ones of the upper contact plug structures 620 may be secured.

Figure 28:
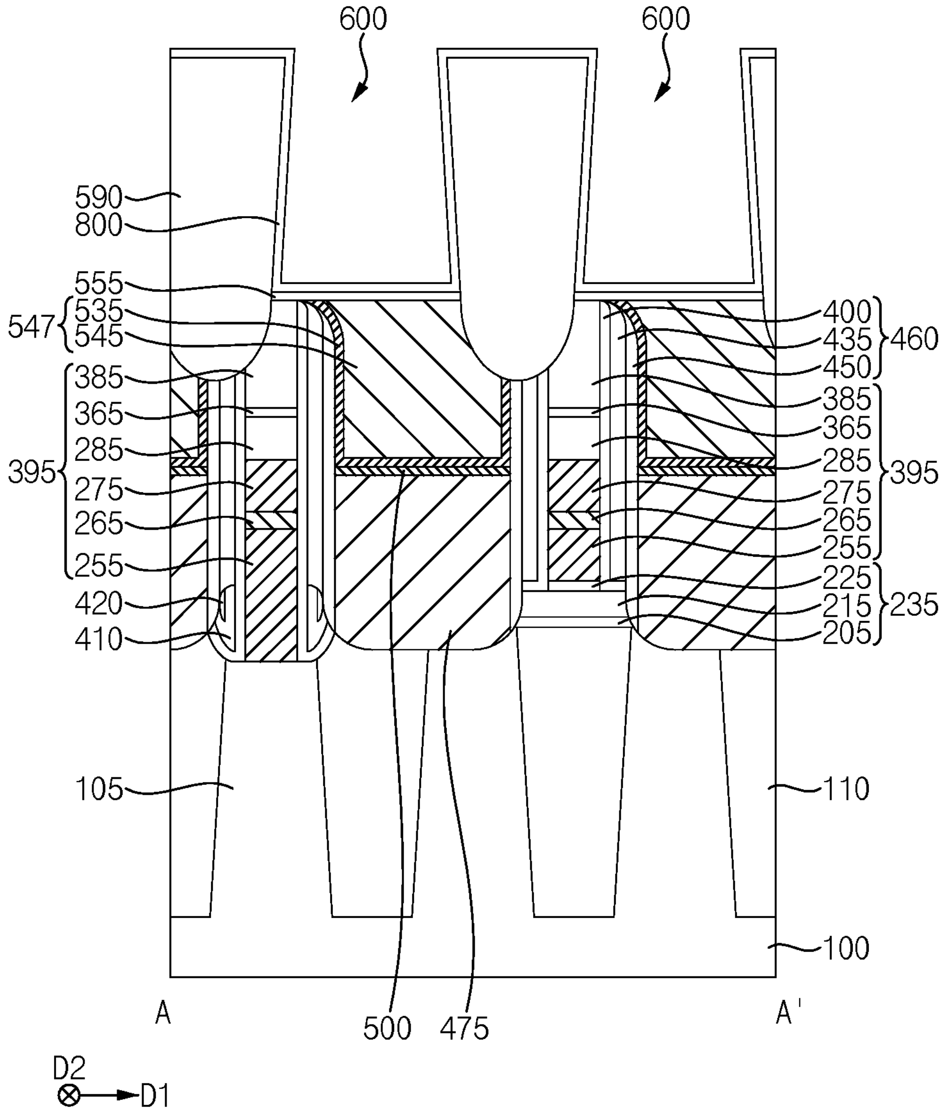
FIGS. 28 and 29 are cross-sectional views illustrating a method of manufacturing a semiconductor device according to example embodiments.
Figure 29:
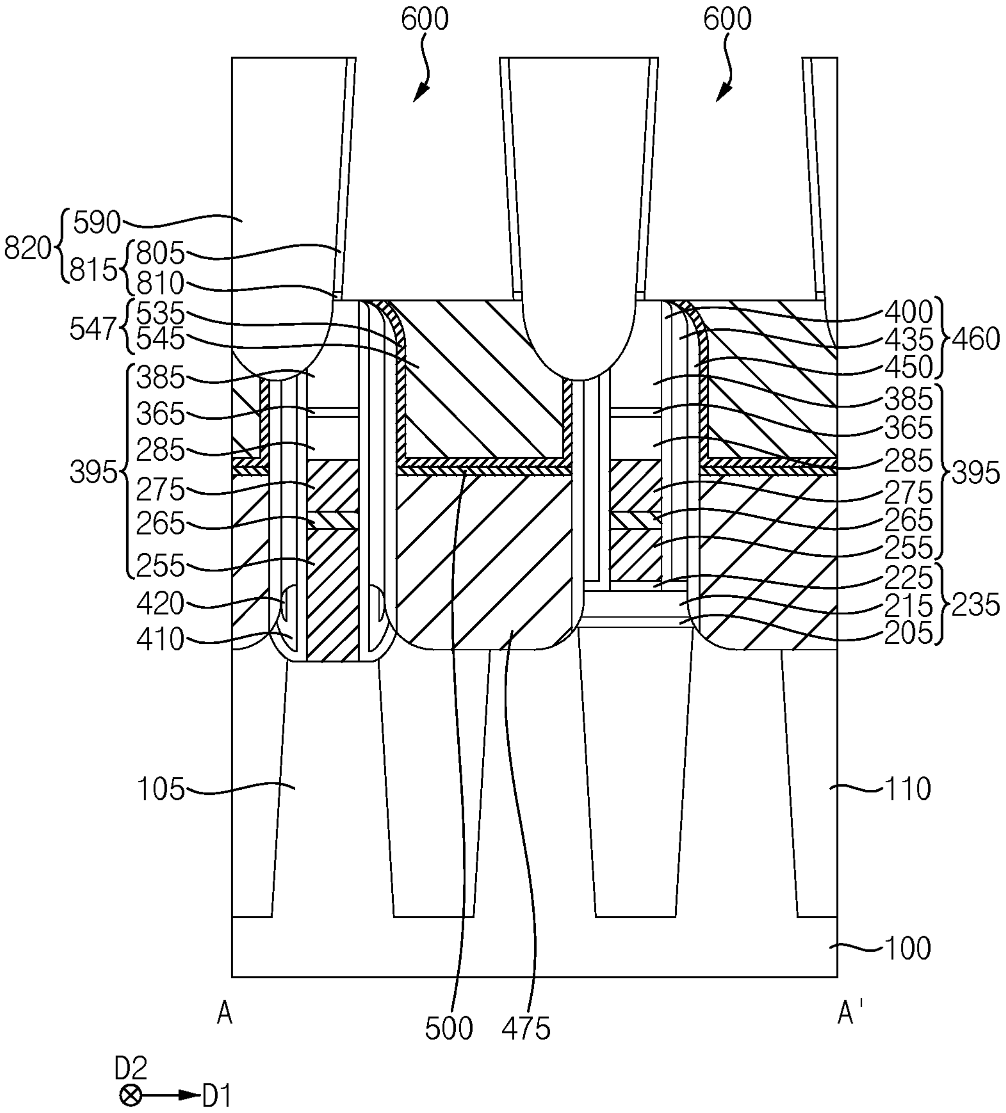

FIGS. 28 and 29 are cross-sectional views illustrating a method of manufacturing the semiconductor device. This method of manufacturing the semiconductor device may include processes substantially the same as or similar to those of FIGS. 1 to 23, and thus repeated explanations thereof are omitted herein.

Referring to FIGS. 28 and 29, processes substantially the same as or similar to those of FIGS. 3 to 21 may be performed. However, the protection pattern 555 may include an insulating nitride, for example, silicon nitride instead of a metal, and thus may be referred to as a seventh insulation pattern 555.

Referring to FIG. 28, after removing the second sacrificial pattern 565, an insulating spacer layer 800 may be formed on the upper surface of the seventh insulation pattern 555 and the sidewall of the sixth insulation pattern 590 exposed by the eighth opening 600.

In example embodiments, the insulating spacer layer 800 may include an insulating nitride, for example, silicon nitride.

Referring to FIG. 29, an anisotropic etching process may be performed on the insulating spacer layer 800 to form a second insulating spacer 805 on the sidewall of the sixth insulation pattern 590, and during the anisotropic etching process, the seventh insulation pattern 555 may also be partially etched and remain as a first insulating spacer 810 under the second insulating spacer 805. The first and second insulating spacers 810 and 805 may collectively form an insulating spacer structure 815, and the insulating spacer structure 815 and the sixth insulation pattern 590 may collectively form a first insulation pattern structure 820.

Thereafter, manufacturing of the semiconductor device may be completed by performing processes substantially the same as or similar to those of FIGS. 22 and 23.

As described above, the insulating spacer structure 815 may be formed on a sidewall of the eighth opening 600, and the fourth metal pattern 610 may be formed to fill a remaining portion of the eighth opening 600. Therefore, the distance between the first upper contact plug 547 and the fourth metal pattern 610 included in the neighboring ones of the upper contact plug structures 620, respectively, may increase. For example, the distance between the neighboring ones of the upper contact plug structures 620 including the first upper contact plug 547 and the fourth metal pattern 610 may be adjusted by the thickness of the insulating spacer structure 815, and thus, the bridging phenomenon may be prevented and/or alleviated.

Figure 30:
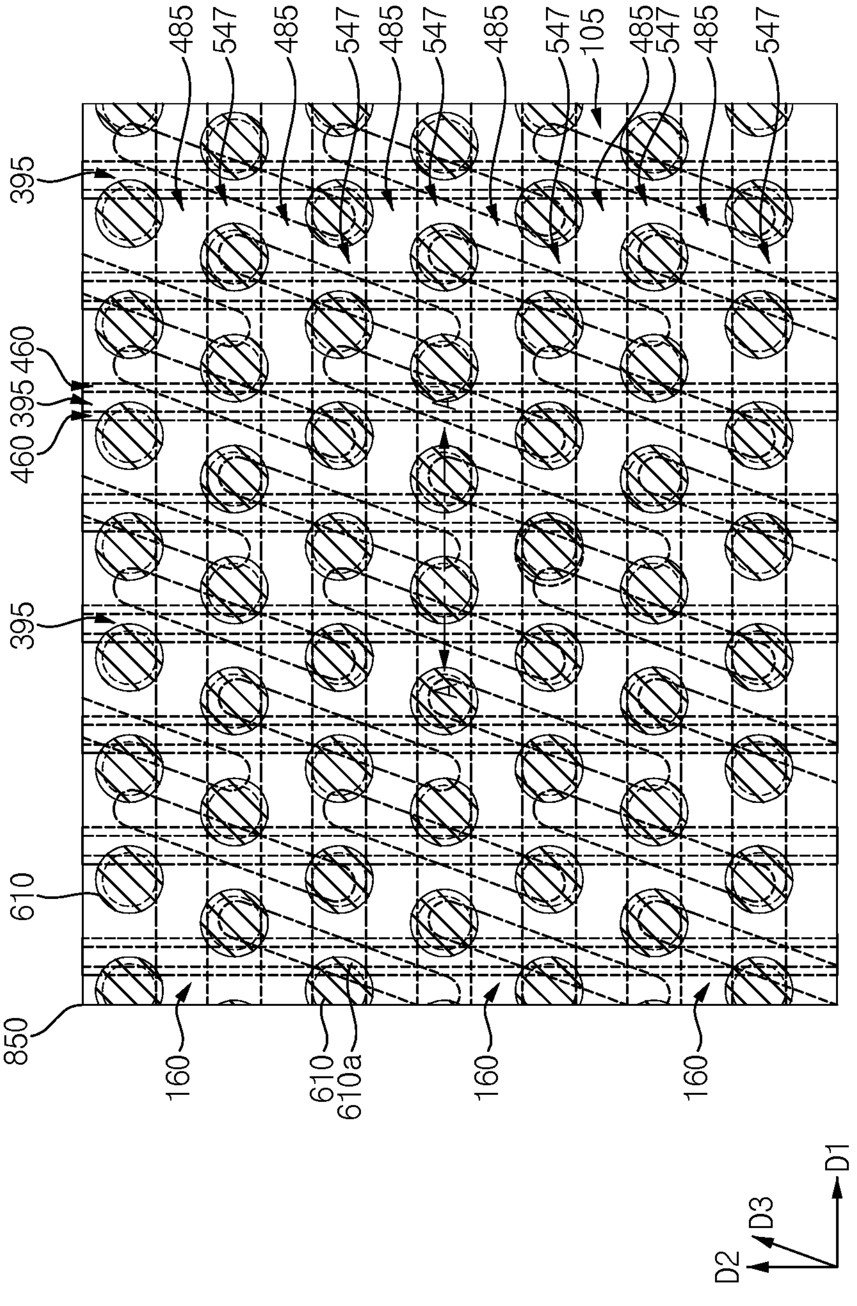
FIGS. 30 and 31 are a plan view and a cross-sectional view, respectively, illustrating a semiconductor device according to example embodiments.
Figure 31:
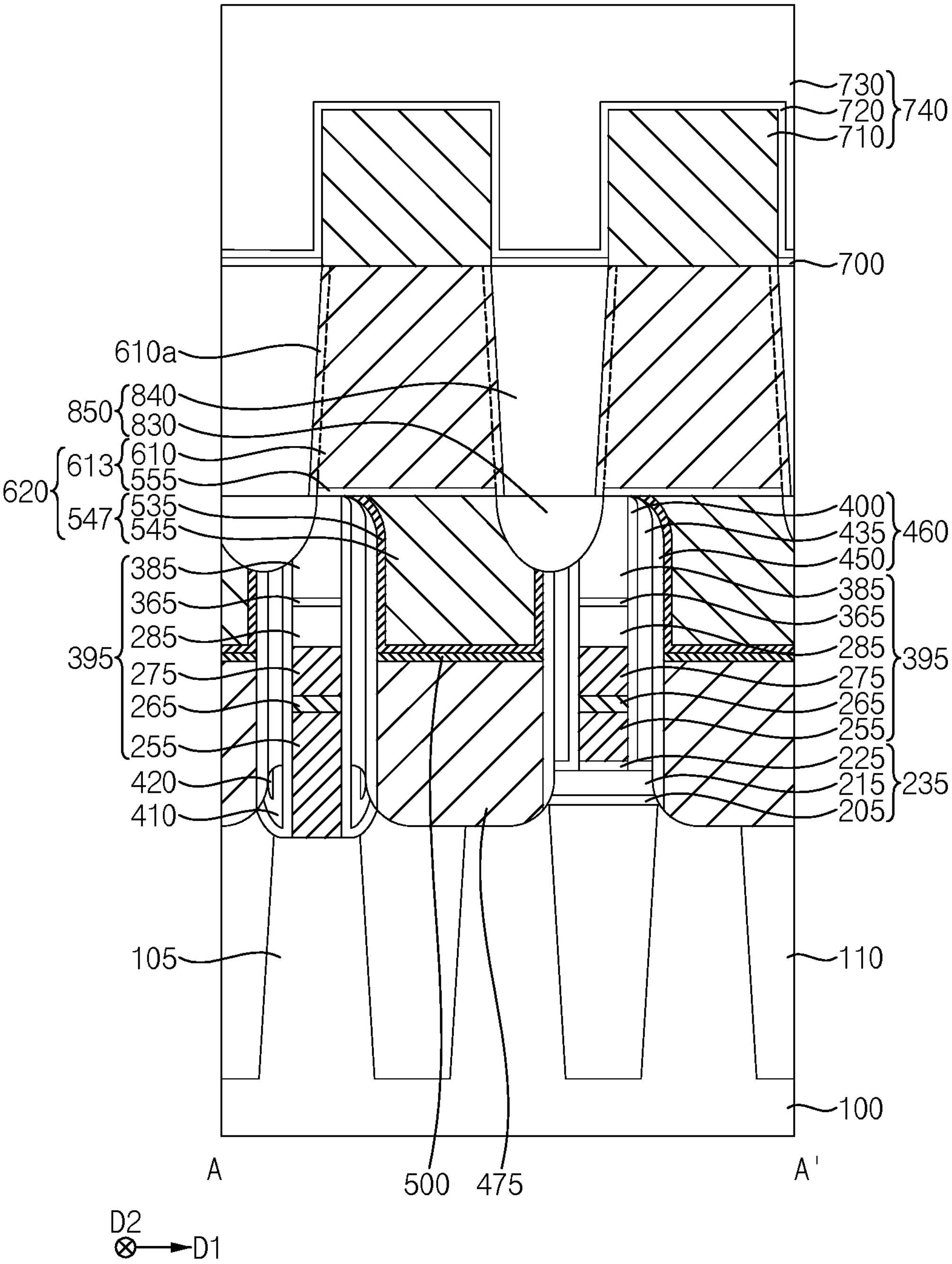

FIGS. 30 and 31 are a plan view and a cross-sectional view, respectively, illustrating a semiconductor device in accordance with example embodiments, which correspond to FIGS. 1 and 2, respectively. The capacitor 740 and the second etch stop pattern 700 are not shown in FIG. 30 to avoid complexity.

This semiconductor device may be substantially the same as or similar to that of FIGS. 1 and 2, except for including a second insulating structure 850 instead of the sixth insulation pattern 590 and the shape of the fourth metal pattern 610, and thus repeated explanations are omitted herein.

Referring to FIG. 31, the fourth metal pattern 610 may be formed on the upper surface of the third metal pattern 555, and may further include an extension portion 610*a* contacting a sidewall of each of the third metal pattern 555.

Accordingly, a maximum width of the fourth metal pattern 610 in the horizontal direction may be greater than a maximum width of the third metal pattern 555 in the horizontal direction.

The second insulation pattern structure 850 may be disposed between neighboring ones of the upper contact plug structures 620. The second insulation pattern structure 850 may include eighth and ninth insulation patterns 830 and 840 sequentially stacked in the vertical direction. An area of an upper surface of the eighth insulation pattern 830 may be greater than an area of a lower surface of the ninth insulation pattern 840. For example, in in the horizontal direction, a width of the upper surface of the eighth insulation pattern 830 may be greater than a width of the lower surface of the ninth insulation pattern 840.

In example embodiments, each of the eighth and ninth insulation patterns 830 and 840 may include a material with a high etch selectivity with respect to the third metal pattern 555, for example, an insulating nitride such as a silicon nitride.

In example embodiments, as the fourth metal pattern 610 further includes the extension portion 610*a*, a sidewall (hereinafter, referred to as a third sidewall) of a portion of the second metal pattern 545 in contact with the eighth insulation pattern 830 of the second insulation pattern structure 850 and a sidewall (hereinafter, referred to as a fourth sidewall) of a portion of the fourth metal pattern 610 in contact with the ninth insulation pattern may not be aligned with each other in the vertical direction, and an upper portion of a sidewall of the eighth insulation pattern 830, an upper surface of the eighth insulation pattern 830 and a sidewall of the ninth insulation pattern 840 may collectively form a step case shape.

FIGS. 32 to 35 are cross-sectional views illustrating a method of manufacturing the semiconductor device. This method of manufacturing the semiconductor device may include processes substantially the same as or similar to those of FIGS. 1 to 23, and thus repeated explanations thereof are omitted herein.

Figure 32:
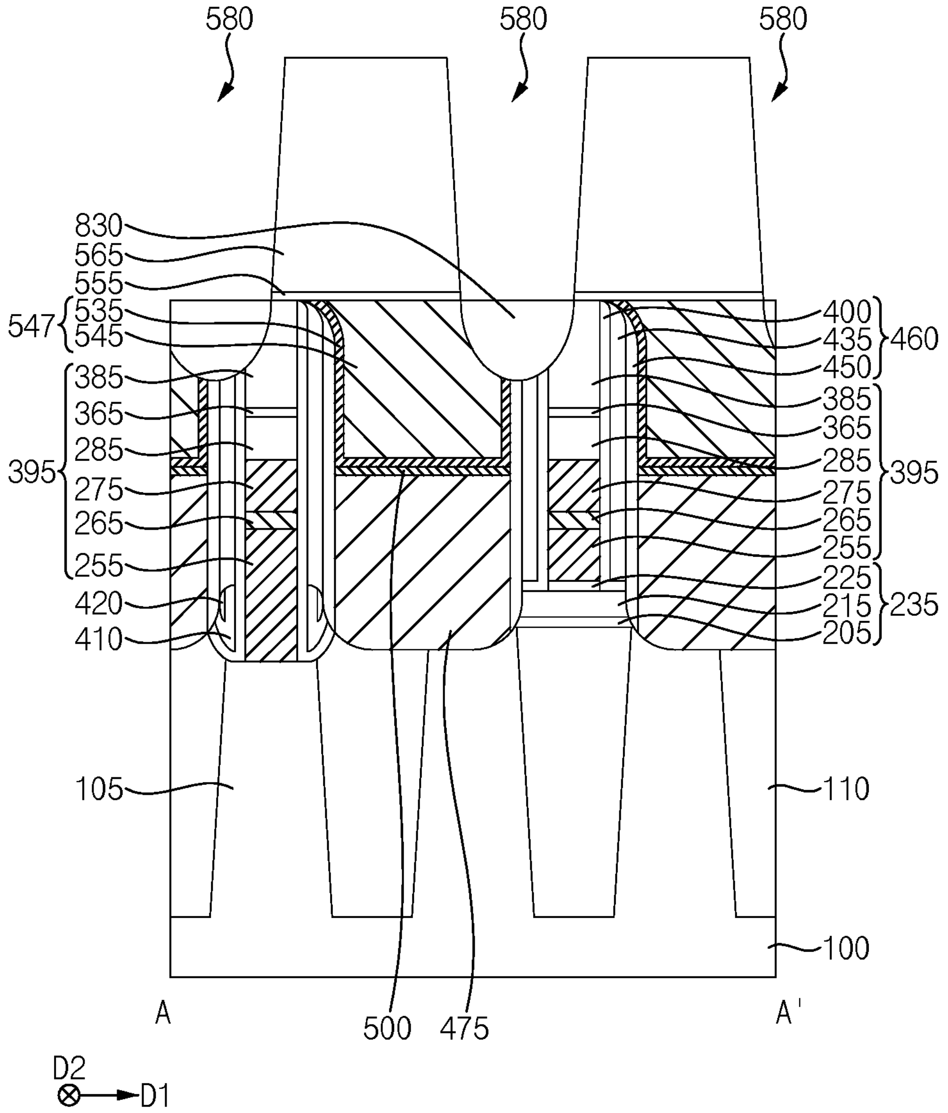
FIGS. 32 to 35 are cross-sectional views illustrating a method of manufacturing a semiconductor device according to example embodiments.

Referring to FIG. 32, processes substantially the same as or similar to those of FIGS. 3 to 19 may be performed. Thereafter, an eighth insulation pattern 830 may be formed on the first upper contact plug 547, the spacer structure 460, and the first and second capping patterns 385 and 485 to fill a lower portion of the seventh opening 580.

In an example embodiment, an upper surface of the eighth insulation pattern 830 may be coplanar with an upper surface of the first upper contact plug 547 as shown in FIG. 32. In another example embodiment, the upper surface of the eighth insulation pattern 830 may be formed to be lower than the upper surface of the first upper contact plug 547.

In example embodiments, the eighth insulation pattern 830 may include an insulating nitride, for example, silicon nitride.

Figure 33:
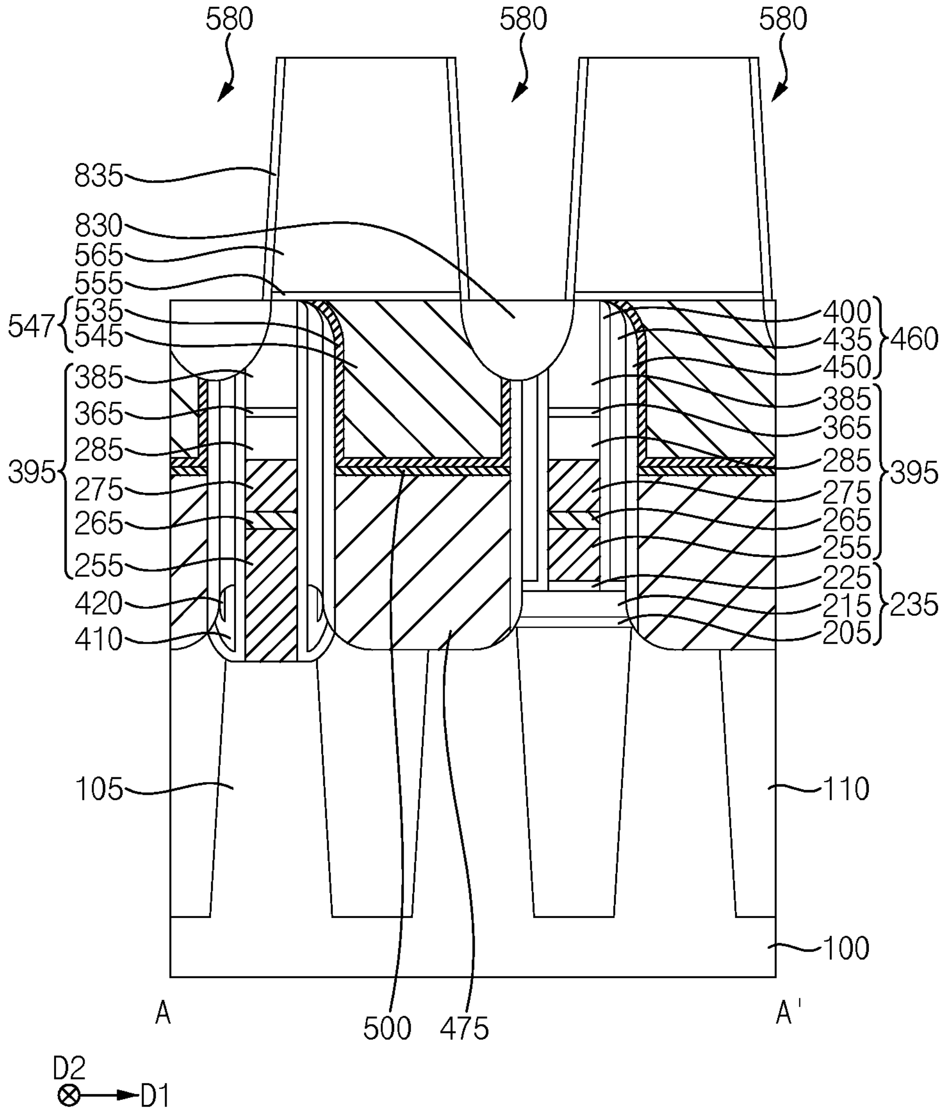

Referring to FIG. 33, a sacrificial spacer layer may be formed on the upper surface of the eighth insulation pattern 830 and a sidewall and an upper surface of the second sacrificial pattern 565, and the sacrificial spacer may be anisotropically etched to form a sacrificial spacer 835 covering the sidewall of the second sacrificial pattern 565.

In example embodiments, the sacrificial spacer 835 may include a material with a high etch selectivity with respect to the eighth insulation pattern 830 and a ninth insulation pattern 840, which may be subsequentially formed, for example, oxide such as silicon oxide.

Figure 34:
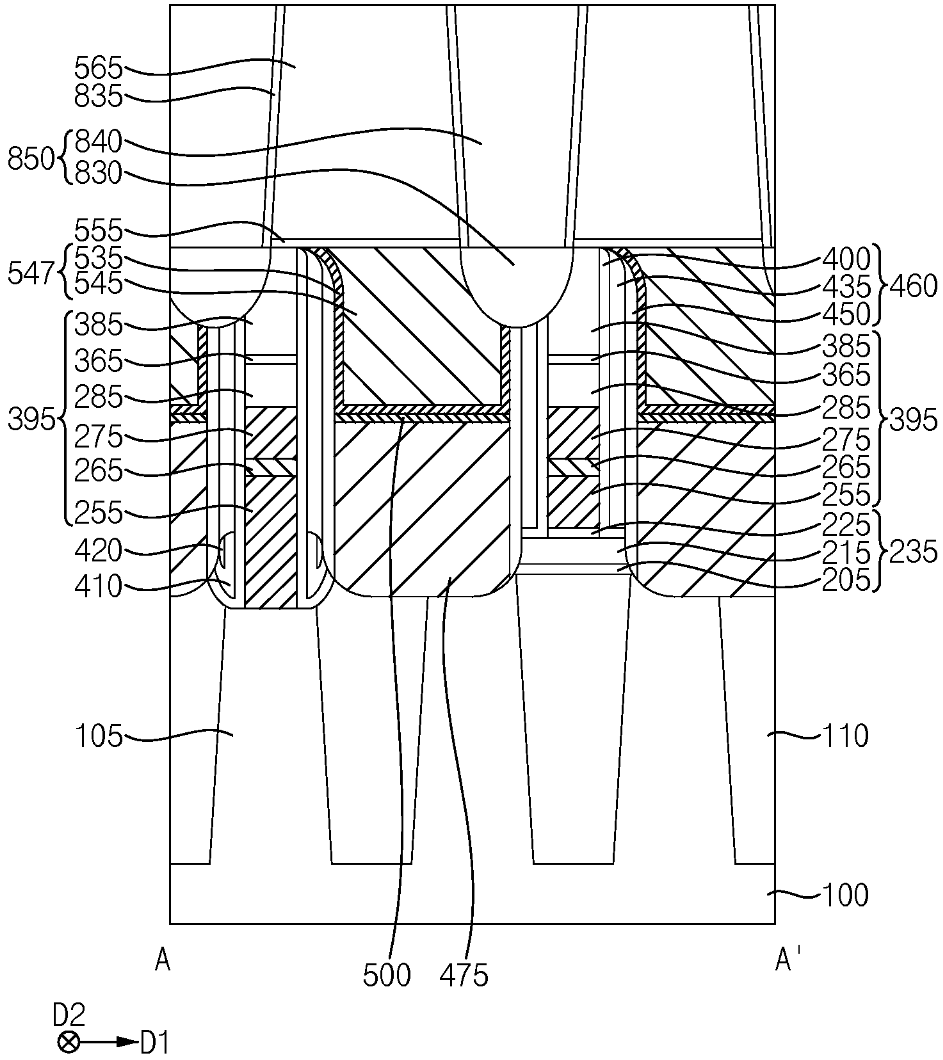

Referring to FIG. 34, a ninth insulation pattern 840 may be formed on the eighth insulation pattern 830 to fill an upper portion of the seventh opening 580. The eighth and ninth insulation patterns 830 and 840 may collectively form a second insulation pattern structure 850.

In example embodiments, the ninth insulation pattern 840 may include an insulating nitride, for example, silicon nitride.

Figure 35:
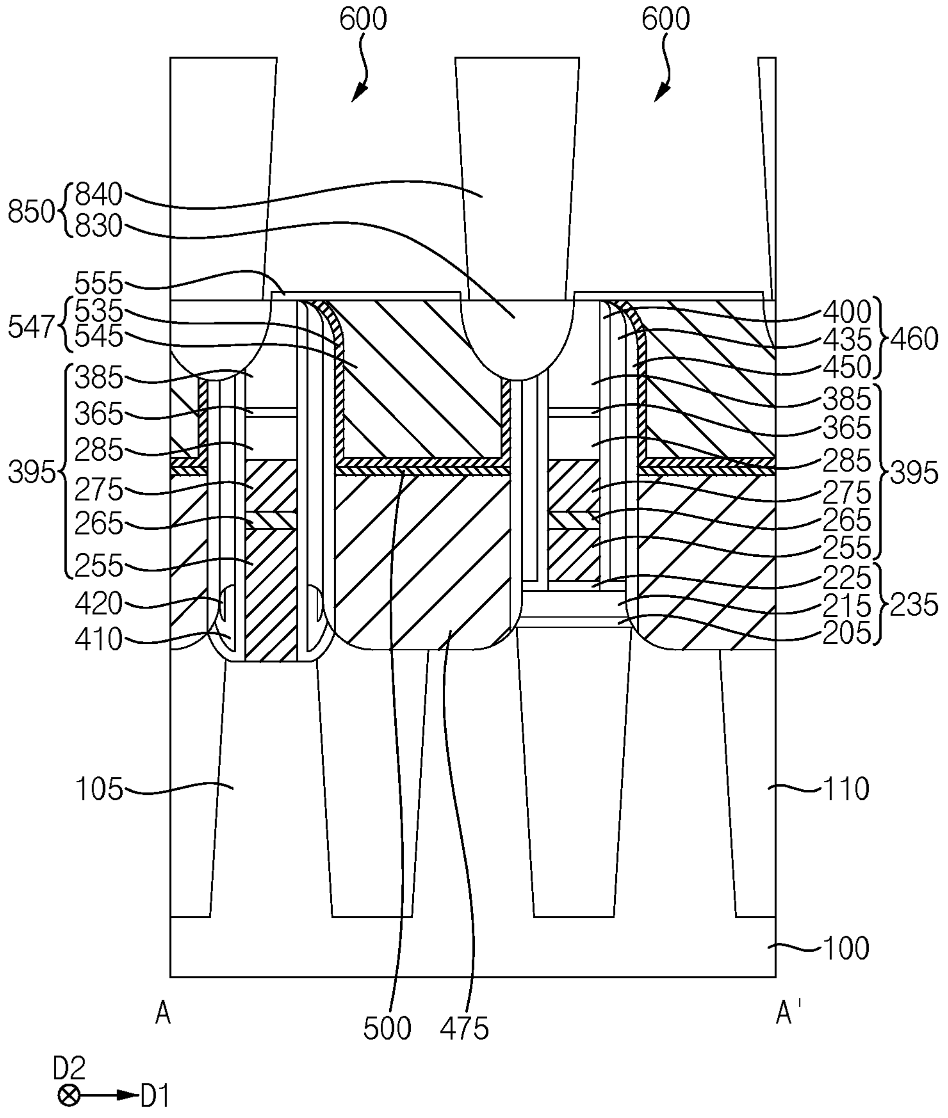

Referring to FIG. 35, the second sacrificial pattern 565 and the sacrificial spacer 835 may be removed by performing an etching process. Accordingly, during the etching process, a sidewall of the third metal pattern 555 and a portion of the upper surface of the first upper contact plug 547 may be exposed.

The third metal pattern 555, and the eighth and ninth insulation patterns 830 and 840 may include a material with a high etch selectivity with respect to the second sacrificial pattern 565 and the sacrificial spacer 835, and may not be removed during the etching process.

Thereafter, manufacturing of the semiconductor device may be completed by performing processes substantially the same as or similar to those of FIGS. 22 and 23. However, unlike the processes described with reference to FIGS. 22 and 23, an extension 610*a* of the fourth metal pattern 610 may be further formed on the sidewall of the eighth opening 600 that may be formed by removing the sacrificial spacer 835.

Figure 36:
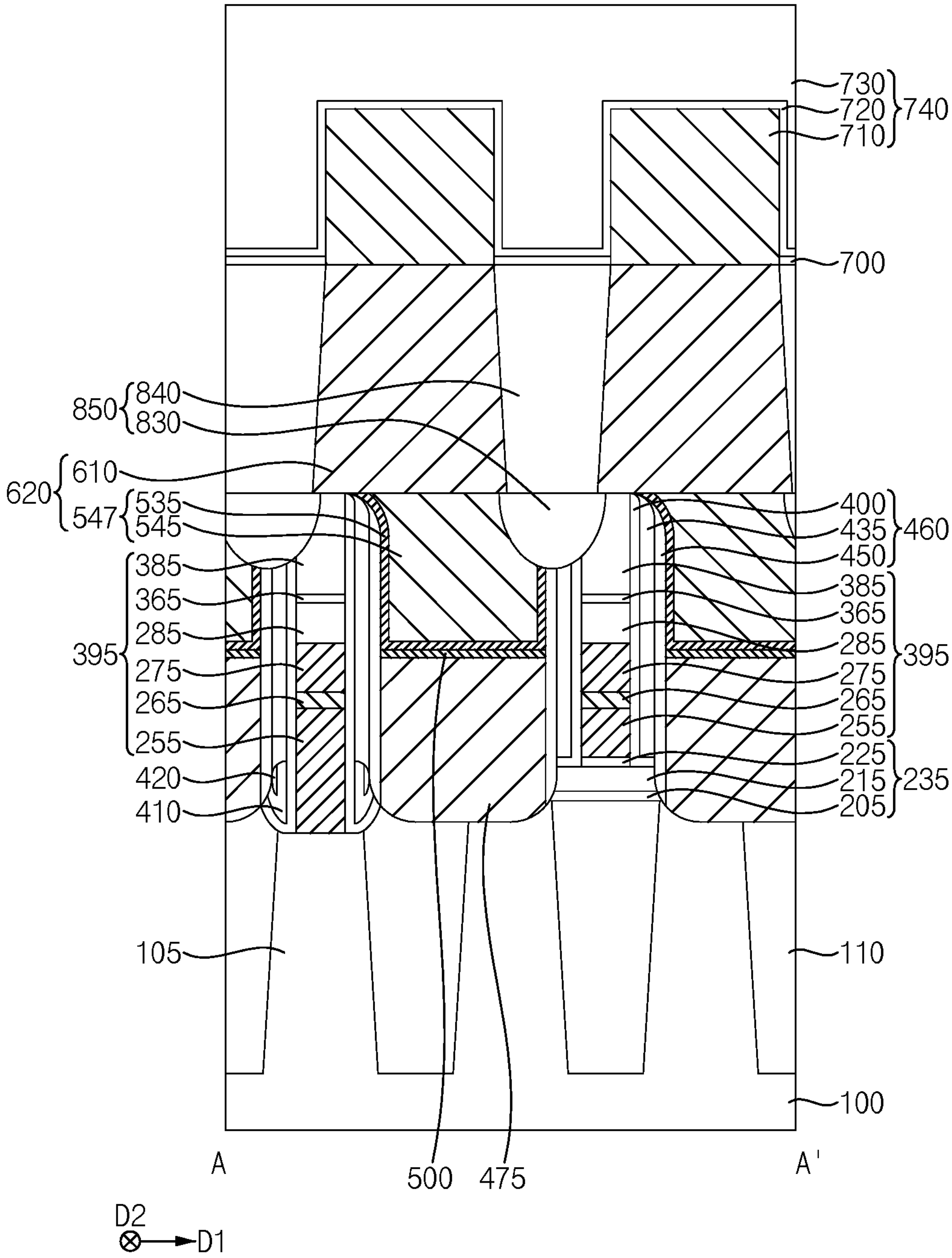
FIG. 36 is a cross-sectional view, respectively, illustrating a semiconductor device according to example embodiments.

FIG. 36 is a cross-sectional view illustrating a semiconductor device in accordance with example embodiments, which corresponds to FIG. 31.

This semiconductor device may be substantially the same as or similar to that of FIG. 31, except that the upper contact plug structure 620 includes only the fourth metal pattern 610 instead of the second upper contact plug 613, and thus repeated explanations are omitted herein.

Figure 37:
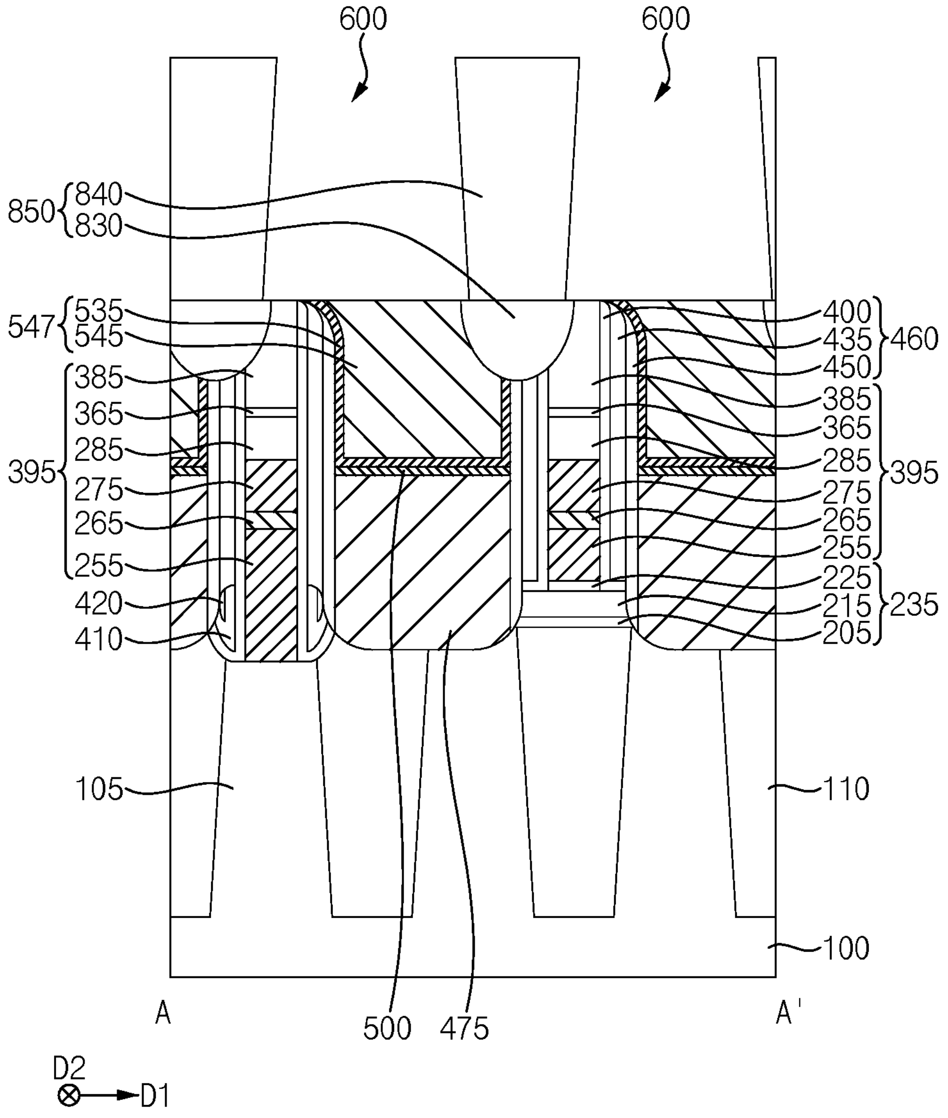
FIG. 37 is a cross-sectional view illustrating a method of manufacturing a semiconductor device according to example embodiments.

FIG. 37 is a cross-sectional view illustrating a method of manufacturing the semiconductor device. This method of manufacturing the semiconductor device may include processes substantially the same as or similar to those of FIGS. 1 to 19, 22, 23, and 32 to 35, and thus repeated explanations thereof are omitted herein.

Referring to FIG. 37, processes substantially the same as or similar to those of FIGS. 3 to 19 and 32 to 34 may be performed. However, the protection pattern 555 may include an insulating nitride, for example, silicon nitride instead of a metal, and may be referred to as the seventh insulation pattern 555.

Thereafter, the second sacrificial pattern 565 may be removed by performing the processes described with reference to FIG. 35, and the seventh insulation pattern 555 exposed by the eighth opening 600 may be further removed. Accordingly, an upper surface of the first upper contact plug 547 may be exposed.

Thereafter, manufacturing of the semiconductor device may be completed by performing processes substantially the same as or similar to those of FIGS. 22 and 23, and the fourth metal pattern 610 may be formed to contact the upper surface of the first upper contact plug 547

Accordingly, a width of the fourth metal pattern 610 in the horizontal direction may be increased by a thickness of the extension portion 610*a* of the fourth metal pattern 610 on the sidewall of the eighth opening 600, which may be formed by removing the sacrificial spacer 835, and thus, a contact area between the fourth metal pattern 610 and the first upper contact plug 547 may be increased.

While example embodiments have been particularly shown and described, it will be understood by one of ordinary skill in the art that variations in form and detail may be made therein without departing from the spirit and scope of the appended claims.

What is claimed is:

1. A semiconductor device, comprising:
an active pattern on a substrate;
a gate structure extending through an upper portion of the active pattern;
a bit line structure on a central portion of the active pattern;
a lower contact plug on each of opposite end portions of the active pattern; and
an upper contact plug structure on the lower contact plug, wherein the upper contact plug structure includes:
a first upper contact plug; and
a second upper contact plug on the first upper contact plug, the second upper contact plug contacting the first upper contact plug,
wherein the first upper contact plug includes a first metal pattern and a barrier pattern covering a lower surface and a sidewall of the first metal pattern, and
wherein an upper surface of the bit line structure contacts a lower surface of the second upper contact plug and does not contact the barrier pattern, and
wherein an uppermost surface of the barrier pattern of the first upper contact plug is coplanar with an uppermost surface of the first metal pattern of the first upper contact plug.

2. The semiconductor device of claim 1, wherein the second upper contact plug includes a second metal pattern and a third metal pattern sequentially stacked, and
wherein a lower surface of the second metal pattern contacts the upper surface of the bit line structure.

3. The semiconductor device of claim 2, wherein the lower surface of the second metal pattern contacts an upper surface of the first metal pattern and an upper surface of the barrier pattern.

4. The semiconductor device of claim 1, further comprising:
an insulation pattern structure contacting a sidewall of the upper contact plug structure,
wherein a first sidewall of the first upper contact plug in contact with the insulation pattern structure and a second sidewall of the second upper contact plug in contact with the insulation pattern structure are not aligned with each other in a vertical direction perpendicular to an upper surface of the substrate.

5. The semiconductor device of claim 4, wherein the insulation pattern structure includes an insulation pattern and an insulating spacer structure covering an upper sidewall of the insulation pattern.

6. The semiconductor device of claim 5, wherein the insulating spacer structure includes a first insulating spacer and a second insulating spacer sequentially stacked on the first upper contact plug and the bit line structure.

7. The semiconductor device of claim 4, wherein the first sidewall of the first upper contact plug, an upper surface of the first upper contact plug adjacent to the first sidewall and the second sidewall of the second upper contact plug collectively form a staircase shape.

8. The semiconductor device of claim 4, wherein the insulation pattern structure includes a first insulation pattern and a second insulation pattern sequentially stacked in the vertical direction, and
wherein, in a first direction parallel to the upper surface of the substrate, a width of an upper surface of the first insulation pattern is greater than a width of a lower surface of the second insulation pattern.

9. The semiconductor device of claim 8, wherein an upper portion of a sidewall of the first insulation pattern, the upper surface of the first insulation pattern and a sidewall of the second insulation pattern collectively form a staircase shape.

10. The semiconductor device of claim 1, further comprising:
a spacer structure on a sidewall of the bit line structure,
wherein the barrier pattern contacts an upper surface and an upper sidewall of the spacer structure.

11. A semiconductor device, comprising:
an active pattern on a substrate;
a gate structure extending through an upper portion of the active pattern;
a bit line structure on a central portion of the active pattern;
a lower contact plug on each of opposite end portions of the active pattern;
an upper contact plug structure including a first upper contact plug and a second upper contact plug sequentially stacked in a vertical direction perpendicular to an upper surface of the substrate; and
an insulation pattern structure contacting a sidewall of the upper contact plug structure,
wherein the insulation pattern structure includes:
an insulation pattern contacting a sidewall of the first upper contact plug; and
an insulating spacer structure covering an upper sidewall of the insulation pattern and contacting a sidewall of the second upper contact plug,
wherein the first upper contact plug includes a first metal pattern and a barrier pattern covering a lower surface and a sidewall of the first metal pattern, and
wherein an uppermost surface of the barrier pattern of the first upper contact plug is coplanar with an uppermost surface of the first metal pattern of the first upper contact plug.

12. The semiconductor device of claim 11, wherein a first sidewall of the first upper contact plug in contact with the insulation pattern and a second sidewall of the second upper contact plug in contact with the insulating spacer structure are not aligned with each other in the vertical direction.

13. The semiconductor device of claim 12, wherein the first sidewall of the first upper contact plug, an upper surface of the first upper contact plug adjacent to the first sidewall and the second sidewall of the second upper contact plug collectively form a stair case shape.

14. The semiconductor device of claim 11, wherein the insulating spacer structure includes a first insulating spacer and a second insulating spacer sequentially stacked on an upper surface of the bit line structure.

15. The semiconductor device of claim 11, further comprising:
a plurality of gate structures, the gate structure being one of the plurality of gate structures;
a plurality of bit line structures, the bit line structure being one of the plurality of bit line structures;
a plurality of lower contact plugs, the lower contact plug being one of the plurality of lower contact plugs;
a plurality of first upper contact plugs, the first upper contact plug being one of the plurality of first upper contact plugs; and
a plurality of second upper contact plugs, the second upper contact plugs being one of the plurality of second upper contact plugs, wherein:

each of the plurality of gate structures extends in a first direction parallel to the upper surface of the substrate, and the plurality of gate structures are spaced apart from each other in a second direction parallel to the upper surface of the substrate and perpendicular to the first direction, each of the bit line structures extends in the second direction, and the plurality of bit line structures are spaced apart from each other in the first direction, the plurality of lower contact plugs are spaced apart from each other in the second direction between the bit line structures, the plurality of first upper contact plugs are spaced apart from each other in the second direction between the bit line structures, and the plurality of second upper contact plugs are spaced apart from each other in the first and second directions, and are arranged in a honeycomb pattern in a plan view.

16. The semiconductor device of claim 15, further comprising:

a plurality of capping patterns spaced apart from each other in the second direction between the bit line structures, each of the plurality of capping patterns contacting a sidewall of the lower contact plug and the sidewall of the first upper contact plug.

17. A semiconductor device, comprising:

an active pattern on a substrate;

a gate structure extending through an upper portion of the active pattern;

a bit line structure on a central portion of the active pattern;

a lower contact plug on each of opposite end portions of the active pattern;

an upper contact plug structure including a first upper contact plug and a second upper contact plug sequentially stacked in a vertical direction perpendicular to an upper surface of the substrate; and an insulation pattern structure contacting a sidewall of the upper contact plug structure, wherein the insulation pattern structure includes:

a first insulation pattern; and a second insulation pattern disposed on and contacting the first insulation pattern, and wherein, in a first direction parallel to the upper surface of the substrate, a width of a lower surface of the second insulation pattern is smaller than a width of an upper surface of the first insulation pattern.

18. The semiconductor device of claim 17, wherein a first sidewall of the first upper contact plug contacting the first insulation pattern and a second sidewall of the second upper contact plug contacting the second insulation pattern are not aligned with each other in the vertical direction.

19. The semiconductor device of claim 18, wherein the first sidewall of the first upper contact plug, the upper surface of the first insulation pattern adjacent to the first sidewall and the second sidewall of the second upper contact plug together form a staircase shape.

20. The semiconductor device of claim 17, wherein the first upper contact plug includes a first metal pattern and a barrier pattern covering a sidewall and a lower surface of the first metal pattern, wherein the second upper contact plug includes a second metal pattern and a third metal pattern sequentially stacked, and wherein the third metal pattern covers an upper surface and a sidewall of the second metal pattern.

* * * * *